United States Patent
Joo et al.

(10) Patent No.: US 11,495,643 B2
(45) Date of Patent: Nov. 8, 2022

(54) ORGANIC LIGHT EMITTING DISPLAY DEVICE HAVING BLACK MATRIX WITH CIRCULAR-SHAPED OPENINGS

(71) Applicant: Samsung Display Co. Ltd., Yongin-si (KR)

(72) Inventors: Sun Kyu Joo, Suwon-si (KR); Byung Chul Kim, Suwon-si (KR); Sung Chul Kim, Seongnam-si (KR); Su Jeong Kim, Yongin-si (KR); In Ok Kim, Osan-si (KR); Hye Ran Mun, Yangju-si (KR); In Seok Song, Pocheon-si (KR); Keun Chan Oh, Hwaseong-si (KR); Jae Jin Lyu, Yongin-si (KR); Yui Ku Lee, Asan-si (KR)

(73) Assignee: SAMSUNG DISPLAY CO. LTD., Yongin-si (KR)

( * ) Notice: Subject to any disclaimer, the term of this patent is extended or adjusted under 35 U.S.C. 154(b) by 116 days.

(21) Appl. No.: 17/036,039

(22) Filed: Sep. 29, 2020

(65) Prior Publication Data
US 2021/0013268 A1   Jan. 14, 2021

Related U.S. Application Data

(63) Continuation of application No. 15/898,346, filed on Feb. 16, 2018, now Pat. No. 10,854,687.

(30) Foreign Application Priority Data

Jul. 4, 2017   (KR) ........................ 10-2017-0085074

(51) Int. Cl.
*H01L 29/08* (2006.01)
*H01L 27/32* (2006.01)
(Continued)

(52) U.S. Cl.
CPC .......... *H01L 27/322* (2013.01); *H01L 27/326* (2013.01); *H01L 27/3211* (2013.01);
(Continued)

(58) Field of Classification Search
CPC ..................................................... H01L 27/322
See application file for complete search history.

(56) References Cited

U.S. PATENT DOCUMENTS 7,348,207 B2 *   3/2008   Kobayashi ............ H01L 27/322
                                                        349/80
10,008,692 B2    6/2018   Kwak
(Continued)

FOREIGN PATENT DOCUMENTS

JP          2015-144087         8/2015
JP          2016-173460         9/2016
(Continued)

OTHER PUBLICATIONS

Korean Notice of Allowance for Korean Patent Application No. 10-2017-0085074, dated Jan. 31, 2022.
(Continued)

*Primary Examiner* — Caleb E Henry
(74) *Attorney, Agent, or Firm* — Kile Park Reed & Houtteman PLLC

(57) ABSTRACT

A light emitting display device comprises a substrate, a first pixel electrode disposed on the substrate, a pixel defining film disposed on the first pixel electrode and having a first opening at least partially exposing the first pixel electrode, a first organic light emitting layer disposed on the pixel defining film and overlapping with the first opening of the pixel defining film, and a black matrix disposed on the first organic light emitting layer and having a first opening overlapping with the first organic light emitting layer. Light having passed through the first opening of the black matrix
(Continued)

is one of red light, green light, and blue light. The first opening of the black matrix may have a shape with a curved portion.

26 Claims, 32 Drawing Sheets

(51) Int. Cl.
*H01L 51/52* (2006.01)
*H01L 51/50* (2006.01)
*H01L 51/56* (2006.01)

(52) U.S. Cl.
CPC ...... *H01L 51/5056* (2013.01); *H01L 51/5072* (2013.01); *H01L 51/5092* (2013.01); *H01L 51/5203* (2013.01); *H01L 51/5284* (2013.01); *H01L 51/56* (2013.01); *H01L 27/3246* (2013.01); *H01L 27/3283* (2013.01)

(56) References Cited

U.S. PATENT DOCUMENTS

| | | | |
|---|---|---|---|
| 2005/0121669 A1* | 6/2005 | Kobayashi | H01L 51/56 257/40 |
| 2007/0069635 A1 | 3/2007 | Cok | |
| 2010/0117528 A1 | 5/2010 | Fukuda | |
| 2010/0265605 A1 | 10/2010 | Lee | |
| 2011/0128643 A1 | 6/2011 | Nakamata | |
| 2011/0155269 A1 | 6/2011 | Martin | |
| 2011/0155296 A1 | 6/2011 | Nakamura et al. | |
| 2015/0097168 A1 | 4/2015 | Hanawa et al. | |
| 2016/0181336 A1 | 6/2016 | Tokuda et al. | |
| 2017/0038636 A1 | 2/2017 | Yu | |
| 2017/0062528 A1 | 3/2017 | Aoyama et al. | |
| 2018/0182814 A1* | 6/2018 | Kim | H01L 27/322 |
| 2018/0331326 A1* | 11/2018 | Woo | H01L 27/3272 |
| 2019/0013363 A1* | 1/2019 | Joo | H01L 27/326 |
| 2019/0245017 A1 | 8/2019 | Jeon et al. | |

FOREIGN PATENT DOCUMENTS

| | | |
|---|---|---|
| KR | 10-2005-0039557 | 4/2005 |
| KR | 10-2014-0083988 | 7/2014 |
| KR | 10-2016-0030444 | 3/2016 |
| KR | 10-2017-0015601 | 2/2017 |
| KR | 10-2017-0057501 | 5/2017 |

OTHER PUBLICATIONS

European Office Action for European Patent Application or Patent No. 18 164 634.0 dated Aug. 23, 2021.

Extended European Search Report of the corresponding European Application or Patent No. 18164634.0 dated Nov. 7, 2018.

\* cited by examiner

ORGANIC LIGHT EMITTING DISPLAY DEVICE HAVING BLACK MATRIX WITH CIRCULAR-SHAPED OPENINGS

This is a continuation application based on currently pending U.S. patent application Ser. No. 15/898,346, filed on Feb. 16, 2018, which issued as U.S. Patent No. 10,856,687 on Dec. 1, 2020, the disclosure of which is incorporated herein by reference in its entirety. U.S. patent application Ser. No. 15/898,346 claims priority benefit of Korean Patent Application No. 10-2017-0085074, filed on Jul. 4, 2017, in the Korean Intellectual Property Office, the disclosure of which is incorporated herein by reference in its entirety for all purposes.

BACKGROUND

1. Field of the Disclosure

The present disclosure relates to an organic light emitting display device.

2. Description of the Related Art

Along with the development of multimedia, display devices are becoming increasingly important. In response to this, several kinds of display devices such as a liquid crystal display (LCD) and an organic light emitting display (OLED) have been used.

Among the display devices, OLEDs display images by using organic light emitting devices that generate light through recombination of electrons and holes. OLEDs have benefits such as a fast response time, high brightness, a large viewing angle, and low power consumption.

SUMMARY

Aspects of the present disclosure provide an organic light emitting display device capable of alleviating reflected color separation due to external light.

Aspects of the present disclosure also provide an organic light emitting display device capable of managing uniform dispersion and reducing reflectivity.

Aspects of the present disclosure also provide an organic light emitting display device capable of reducing costs because no polarizing plate is used.

It should be noted that objects of the present inventive concept are not limited to the above-described objects, and other objects of the present inventive concept will be apparent to those skilled in the art from the following descriptions.

An exemplary embodiment of the present inventive concept discloses a display device comprising: An organic light emitting display device comprising: a substrate; a first pixel electrode disposed on the substrate; a pixel defining film disposed on the first pixel electrode and having a first opening at least partially exposing the first pixel electrode; a first organic light emitting layer disposed on the pixel defining film and overlapping with the first opening of the pixel defining film; and a black matrix disposed on the first organic light emitting layer and having a first opening overlapping with the first organic light emitting layer. Light having passed through the first opening of the black matrix is one of red light, green light, and blue light. The first opening of the black matrix may have a shape with a curved portion.

An exemplary embodiment of the present inventive concept also discloses a display device comprising: an organic light emitting display device comprising: a substrate; a first pixel electrode disposed on the substrate; a pixel defining film disposed on the first pixel electrode and having a first opening at least partially exposing the first pixel electrode; a first organic light emitting layer disposed on the pixel defining film and overlapping with the first opening of the pixel defining film; and a black matrix disposed on the first organic light emitting layer and having a first opening overlapping with the first organic light emitting layer. The first opening of the back matrix may have a smaller area than the first opening of the pixel defining film.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION OF THE EMBODIMENTS

Figure 1:
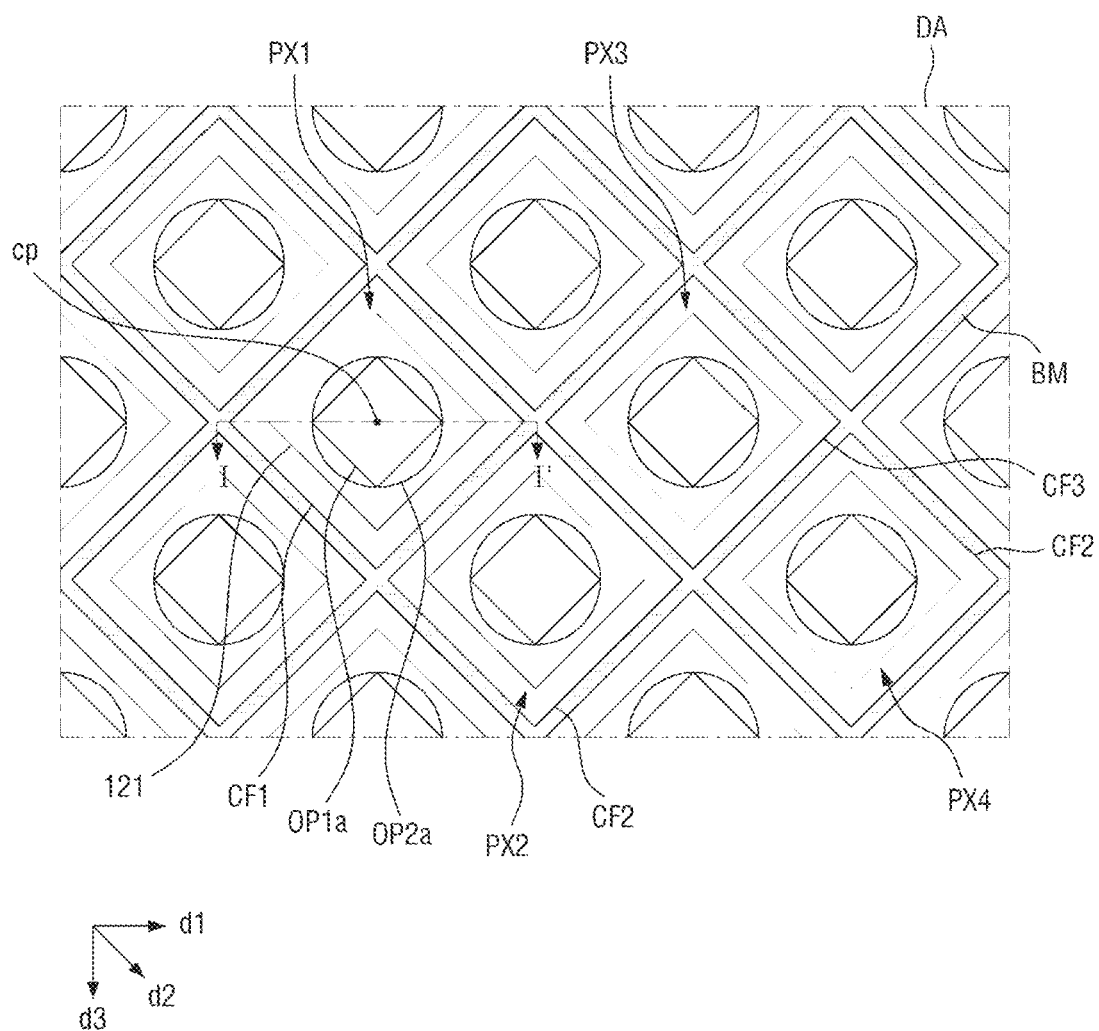
FIG. 1 is a plan view showing a pixel layout of an organic light emitting display device according to an embodiment of the present inventive concept.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Hereinafter, exemplary embodiments will be described with reference to the accompanying drawings.

FIG. 1 is a plan view showing a pixel layout of an organic light emitting display device according to an embodiment of the present inventive concept.

Referring to FIG. 1, a plurality of pixel units including first to fourth pixels PX1 to PX4 may be disposed in a pixel area DA.

An arrangement of the first to fourth pixels PX1 to PX4 will be described with reference to FIG. 1. The first pixel PX1 and the third pixel PX3 may be disposed adjacent to each other in a first direction d1. The second pixel PX2 and the fourth pixel PX4 may be disposed adjacent to each other in the first direction d1. The first pixel PX1 and the second pixel PX2 may be disposed adjacent to each other in a second direction d2, which is a diagonal direction with respect to the first direction d1 and a third direction d3 which is perpendicular to the first direction d1. The third pixel PX3 and the fourth pixel PX4 may be disposed adjacent to each other in the second direction d2.

A plurality of color filters may include first, second, and third color filters CF1, CF2, and CF3. In this disclosure, the first color filter CF1 may be a red color filter, the second color filter CF2 may be a green color filter, and the third color filter CF3 may be a blue color filter. However, the first color filter CF1, the second color filter CF2, and the third color filter CF3 are not limited to red, green, and blue color filters, respectively. For example, each of the first color filter CF1, the second color filter CF2, and the third color filter CF3 may be any one of a cyan color filter, a magenta color filter, and a yellow color filter. Here, as an example, it will be described that the first color filter CF1 is a red color filter, the second color filter CF2 is a green color filter, and the third color filter CF3 is a blue color filter. In this disclosure, the same reference numeral will be used to describe color filters which transmit light in the same wavelength region.

The first pixel PX1 may overlap with the first color filter CF1. The second pixel PX2 and the fourth pixel PX4 may overlap with the second color filter CF2. Also, the third pixel PX3 may overlap with the third color filter CF3. Thus, the first pixel PX1 may display a red color, and the second pixel PX2 and the fourth pixel PX4 may display a green color. Also, the third pixel PX3 may display a blue color.

Here, the first to fourth pixels PX1 to PX4, which display red, green, blue, and green colors, may constitute a single pixel unit. That is, as a red-green-blue-green (RGBG) pentile, the first to fourth pixelsPX1 to PX4 may be disposed in the pixel area DA. However, the arrangement of the plurality of pixels disposed in the pixel area DA is not limited to that shown in FIG. 1. For example, the arrangement of the plurality of pixels may vary depending on the display colors of the pixels, the resolution, and the aperture ratio of an applied organic light emitting display device, and so on.

In this disclosure, the expression "a first element and a second element overlap with each other" indicates that the first element overlaps with the second element when projected onto a first substrate 110.

Here, relations between a first pixel electrode 121, an opening OP1a of a pixel defining film 130 (see FIG. 2), and an opening OP2a of a black matrix BM will be described on the basis of the first pixel PX1.

The first pixel PX1 may include the first pixel electrode 121. The first pixel electrode 121 may be partially exposed by the opening OP1a of the pixel defining film 130 (see FIG. 2). The first pixel electrode 121 may overlap with the opening OP1a of the pixel defining film 130 (see FIG. 2) and the opening OP2a of the black matrix BM.

The first pixel electrode 121 may overlap with the first color filter CF1. More specifically, the first color filter CF1 may overlap with the first pixel electrode 121 by covering the opening OP2a of the black matrix BM. Thus, the first pixel PX1 may display a red color because light emitted from a first organic light emitting layer 141 (see FIG. 2) becomes red after passing through the first color filter CF1.

As an example, the first pixel electrode 121 may have a rhombus shape. Also, as an example, the opening OP1a of the pixel defining film 130 (see FIG. 2) may have a rhombus shape. Here, the rhombus shape may include the shape of a figure that is substantially the same as a rhombus (e.g., a quadrangle) in consideration of a manufacturing process or the like, as well as the shape of a rhombus. The shape of the first pixel electrode 121 and the shape of the opening OP1a of the pixel defining film 130 (see FIG. 2) are not limited to those shown in FIG. 1. That is, the shape of the first pixel electrode 121 and the shape of the opening OP1a of the pixel defining film 130 (see FIG. 2) may vary depending on the arrangement of the plurality of pixels.

The shape of the opening OP2a of the black matrix BM may have a curved portion. In this disclosure, the term "curved portion" is defined as a region having a predetermined curvature. Thus, the shape of the opening OP2a of the black matrix BM may include a region having a predetermined curvature, i.e., a curved portion.

More specifically, the opening OP2a of the black matrix BM may have a substantially circular shape. That is, the planar shape of the opening OP2a of the black matrix BM may be a curved line which is composed of assemblies of dots that are spaced a certain distance apart from a virtual center point cp. The opening OP2a of the black matrix BM may omnidirectionally and uniformly induce diffraction of light on the basis of the virtual center point cp. This will be described in detail below with reference to FIGS. 3 to 6. In this disclosure, the circular shape may include the shape of a polygon substantially close to a circle, an ellipse, or a figure having at least one curved portion in consideration of a manufacturing process or the like, as well as the shape of a circle. Here, in this disclosure, a polygon close to a circle, an ellipse, or a figure with at least one curved portion is described as a "circular shape."

Figure 2:
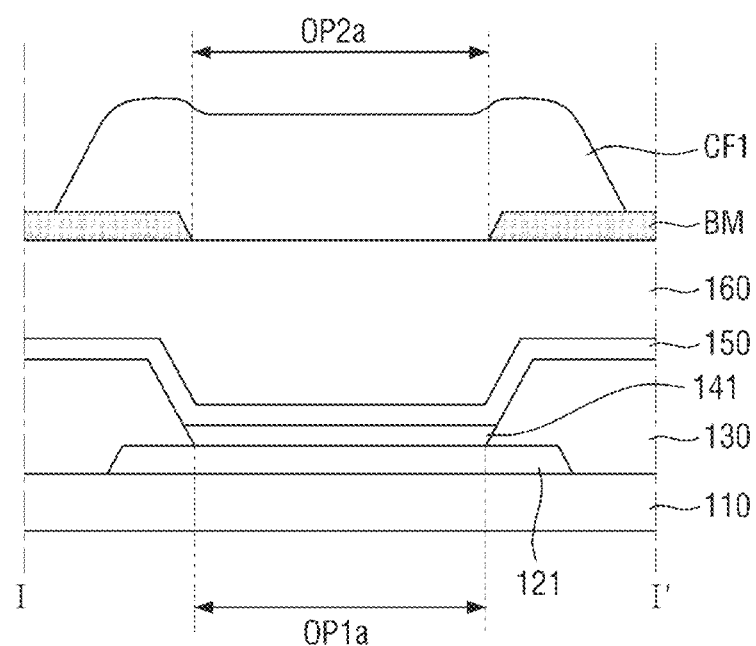
FIG. 2 is a sectional view taken along line I-I' shown in FIG. 1.

FIG. 2 is a sectional view taken along line I-I' shown in FIG. 1. The following description will be provided with reference to the first pixel PX1, as described above.

Referring to FIGS. 1 and 2, the organic light emitting display device according to an embodiment of the present inventive concept may include the first substrate 110, the first pixel electrode 121, the pixel defining film 130, the first organic light emitting layer 141, a common electrode 150, an encapsulation layer 160, the black matrix BM, the first color filter CF1, the second color filter CF2, and the third color filter CF3.

The first substrate 110 may be an insulating substrate. As an example, the first substrate 110 may include materials such as glass, quartz, and polymer resins. Here, the polymer materials may include polyethersulphone (PES), polyacrylate (PA), polyarylate (PAR), polyetherimide (PEI), polyethylenenaphthalate (PEN), polyethyleneterephthalate (PET), polyphenylenesulfide (PPS), polyallylate, polyimide (PI), polycarbonate (PC), cellulosetriacetate (CAT), cellulose acetate propionate (CAP), or a combination thereof. As another example, the first substrate 110 may be a flexible substrate including polyimide (PI).

The first pixel electrode 121 may be disposed on the first substrate 110. Although not shown, other elements may be additionally disposed between the first substrate 110 and the first pixel electrode 121. As an example, the other elements may include a buffer layer, a conductive wire, an insulation layer, and a plurality of thin-film transistors. Here, the plurality of thin-film transistors may use amorphous silicon, polysilicon, low temperature polysilicon (LTPS), an oxide semiconductor, an organic semiconductor, or the like as a channel layer. The plurality of thin-film transistors may have different types of channel layers. As an example, both of a thin-film transistor including an oxide semiconductor and a thin-film transistor including LTPS may be included in one pixel, in consideration of roles or manufacturing processes of the thin-film transistors.

As an example, the first pixel electrode 121 may be an anode electrode. When the first pixel electrode 121 is an anode electrode, the first pixel electrode 121 may include a high work function material to facilitate hole injection. Also, the first pixel electrode 121 may be a reflective electrode, a semitransparent electrode, or a transparent electrode. As an example, the first pixel electrode 121 may include a reflective material. The reflective material may include, as an example, one or more selected from the group consisting of silver (Ag), magnesium (Mg), chromium (Cr), gold (Au), platinum (Pt), nickel (Ni), copper (Cu), tungsten (W), aluminum (Al), aluminum-lithium (Al—Li), magnesium-indium (Mg—In), and magnesium-silver (Mg—Ag).

As an example, the first pixel electrode 121 may be formed as a single-layered film, but is not limited thereto. That is, the first pixel electrode 121 may be formed as a multi-layered film in which two or more materials are stacked.

When the first pixel electrode 121 is formed as a multi-layered film, the first pixel electrode 121 may include, as an example, a reflective film and a transparent or semitransparent electrode disposed above the reflective film. As another example, the first pixel electrode 121 may include a reflective film and a transparent or semitransparent electrode disposed below the reflective film. For example, the first pixel electrode 121 may have a three-layered structure of ITO/Ag/ITO, but is not limited thereto.

Here, the transparent or semitransparent electrode may include one or more selected from the group consisting of indium tin oxide (ITO), indium zinc oxide (IZO), zinc oxide (ZnO), indium oxide ($In_2O_3$), indium gallium oxide (IGO), and aluminum zinc oxide (AZO).

The pixel defining film 130 may be disposed on the first pixel electrode 121. The pixel defining film 130 includes the opening OP1a that at least partially exposes the first pixel electrode 121. The pixel defining film 130 may include an organic material or an inorganic material. As an example, the pixel defining film 130 may include materials such as a photoresist, a polyimide resin, an acrylic resin, a silicon compound, and a polyacrylic resin.

The first organic light emitting layer 141 may be disposed on the first pixel electrode 121. More specifically, the first organic light emitting layer 141 may be disposed on a region of the first pixel electrode 121 to cover the opening OP1a of the pixel defining film 130. As an example, the first organic light emitting layer 141 may at least partially cover a side wall of the pixel defining film 130.

As an example, the first organic light emitting layer 141 may emit red light. That is, the first organic light emitting layer 141 may include a red light emitting material. As another example, the first organic light emitting layer 141 may emit white light. That is, the first organic light emitting layer 141 may include a white light emitting material. Unlike this, the first organic light emitting layer 141 may have a form in which a red light emitting layer, a green light emitting layer, and a blue light emitting layer are stacked to emit white light. In this disclosure, an example in which the first organic light emitting layer 141 emits red light and the other organic light emitting layers emit any one of red light, green light, and blue light will be described below.

Although not shown, the first organic light emitting layer 141 may have a multi-layered structure including a hole injection layer HIL, a hole transport layer HTL, an electron transport layer ETL, an electron injection layer EIL, and so on.

The common electrode 150 may be disposed on the first organic light emitting layer 141 and the pixel defining film 130. As an example, the common electrode 150 may be formed over the first organic light emitting layer 141 and the pixel defining film 130. As an example, the common electrode 150 may be a cathode electrode. The common electrode 150 may include one or more selected from the group consisting of Li, Ca, LiF/Ca, LiF/Al, Al, Ag, and Mg. Also, the common electrode 150 may be formed of a low work function material. As an example, the common electrode 150 may be a transparent or semitransparent electrode including any one or more selected from the group consisting of indium tin oxide (ITO), indium zinc oxide (IZO), zinc oxide (ZnO), indium oxide ($In_2O_3$), indium gallium oxide (IGO), and aluminum zinc oxide (AZO).

The encapsulation layer 160 may be disposed on the first substrate 110 to cover the first organic light emitting layer 141. That is, a plurality of organic light emitting devices including the first organic light emitting layer 141 may be disposed between the first substrate 110 and the encapsulation layer 160. The encapsulation layer 160 may block penetration of external oxygen and moisture into the plurality of organic light emitting devices which include the first organic light emitting layer 141.

As an example, the encapsulation layer 160 may have a form in which at least one of an organic layer and an inorganic layer is stacked in a single-layered structure or a multi-layered structure. The organic layer may include any one selected from the group consisting of epoxy, acrylate, and urethane acrylate. The inorganic layer may include any one or more selected from the group consisting of silicon oxide (SiOx), silicon nitride (SiNx), and silicon oxynitride (SiONx). As an example, the encapsulation layer 160 may have a form in which a first inorganic layer, an organic layer disposed on the first inorganic layer, and a second inorganic layer disposed on the organic layer are stacked.

As another example, the encapsulation layer 160 may be a transparent insulating substrate. When the encapsulation layer 160 is a transparent insulating substrate, the transparent insulating substrate may be a glass substrate, a quartz substrate, a transparent resin substrate, etc. Also, an adhesion layer may be disposed between the transparent insulating substrate and the first substrate 110 in order to bond the transparent insulating substrate and the first substrate 110.

Meanwhile, the encapsulation layer 160 may be omitted when the color filter and the black matrix BM additionally serve as an encapsulation layer.

Although not shown, a capping layer may be additionally included between the common electrode 150 and the encapsulation layer 160. The capping layer can prevent light incident on the common electrode 150 from being lost by total reflection. As an example, the capping layer may be formed as an organic film or an inorganic film.

The black matrix BM may be disposed on the encapsulation layer 160. The black matrix BM may be disposed on the encapsulation layer 160 to cover an entire surface of the encapsulation layer 160 except regions of opening OP2a. A material with high absorption for visible light may be used for the black matrix BM. As an example, the black matrix BM may include a metal such as chromium (Cr), a metal nitride, a metal oxide, a resin material colored in black, or the like.

The opening OP2a of the black matrix BM may overlap with the first organic light emitting layer 141 and the opening OP1a of the pixel defining film 130. Thus, light emitted from the first organic light emitting layer 141 may pass through the opening OP1a of the pixel defining film 130 and the opening OP2a of the black matrix BM. Although not shown, a buffer layer or an organic layer may be formed between the black matrix BM and the encapsulation layer 160. The buffer layer or the organic layer may be formed in a single-layered structure or a multi-layered structure. The opening OP2a of the black matrix BM may completely expose the opening OP1a of the pixel defining film 130 in a plan view.

The first color filter CF1, the second color filter CF2, and the third color filter CF3 may be disposed on the black matrix BM. The black matrix BM may be disposed at a boundary between the plurality of color filters including the first color filter CF1, the second color filter CF2, and the third color filter CF3.

The first color filter CF1 may selectively transmit red light. Here, the red light may have a wavelength ranging from about 620 nm to about 750 nm. The second color filter CF2 may selectively transmit green light. Here, the green light may have a wavelength ranging from about 495 nm to about 570 nm. The third color filter CF3 may selectively transmit blue light. Here, the blue light may have a wavelength ranging from about 450 nm to about 495 nm. As an example, the first color filter CF1, the second color filter CF2, and the third color filter CF3 may include a resin containing pigment or dye. As another example, the first color filter CF1, the second color filter CF2, and the third color filter CF3 may include different materials which are formed through different processes.

As an example, the first color filter CF1, the second color filter CF2, and the third color filter CF3 may have a rhombus shape. Thus, it is possible to minimize separation distances between the first color filter CF1 and its adjacent color filters. Meanwhile, in FIG. 1, the adjacent color filters are shown as not overlapping with each other, but the adjacent color filters may overlap with each other. When the adjacent color filters overlap with each other, an overlapped portion may overlap with the black matrix BM. Also, the shape and size of the first color filter CF1, the second color filter CF2, and the third color filter CF3 are not limited to those shown in FIGS. 1 and 2. Meanwhile, in this disclosure, an example in which a color filter is disposed on the black matrix BM has been described. Unlike this, the black matrix BM may be disposed on the color filter.

Figure 3:
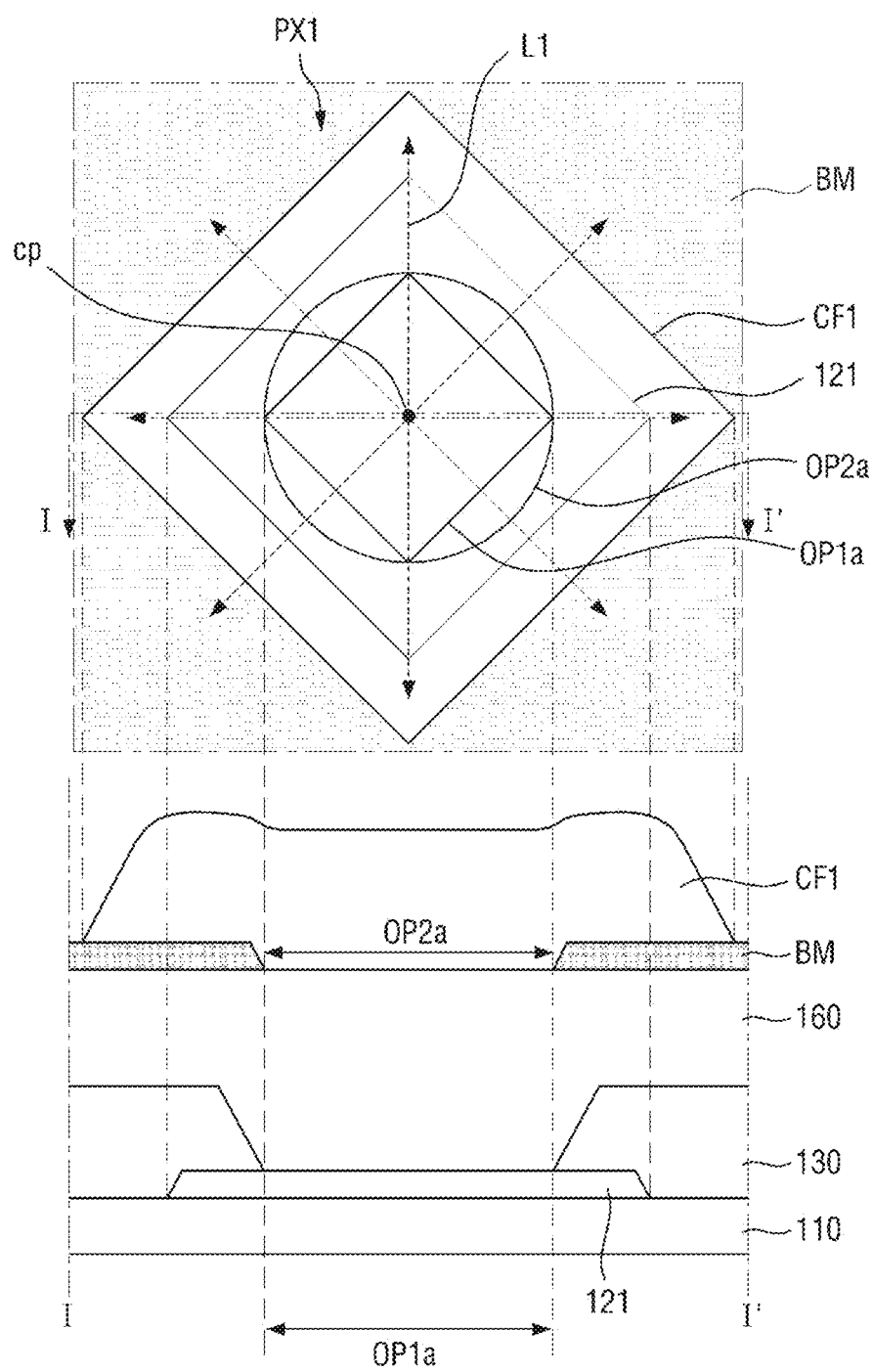
FIG. 3 is a view for comparison between FIG. 1, which is a plan view of a first pixel, and FIG. 2, which is a sectional view taken along line I-I'.
Figure 4:
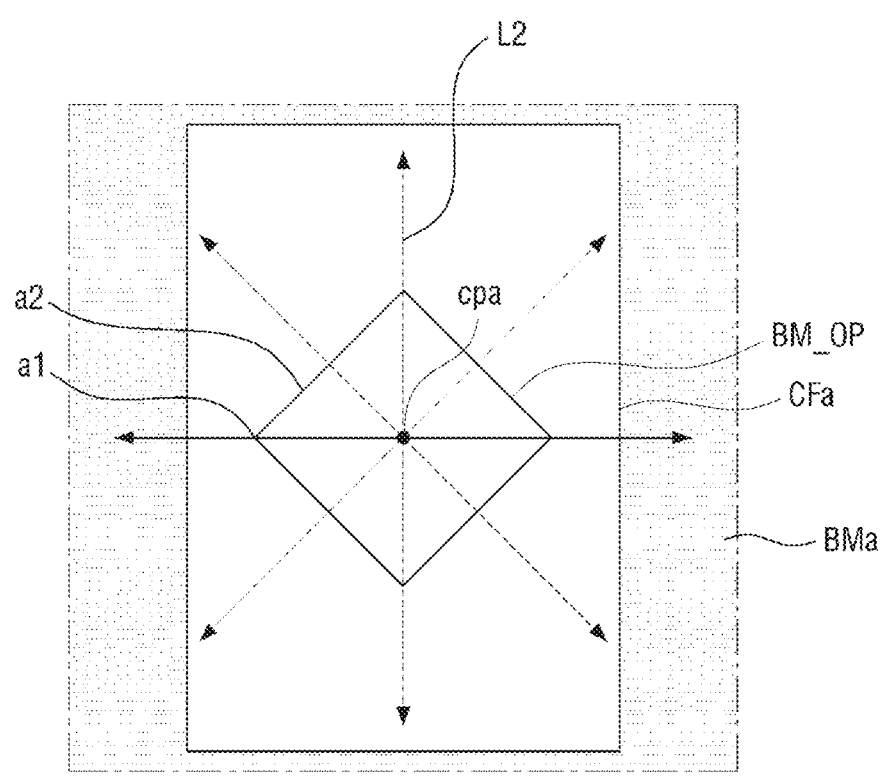
FIG. 4 is a plan view showing a color filter and an opening of a black matrix of an organic light emitting display device according to a comparative example.

FIG. 3 is a view for comparison between FIG. 1, which is a plan view of a first pixel, and FIG. 2, which is a sectional view taken along line I-I'. FIG. 4 is a plan view showing a color filter and an opening of a black matrix of an organic light emitting display device according to a comparative example. For convenience of description, some elements included in the organic light emitting display device may be omitted in FIGS. 3 and 4.

Referring to FIG. 3, the opening OP2a of the black matrix BM may have a circular shape. That is, the opening OP2a of the black matrix BM has a circular shape and thus can omnidirectionally and uniformly induce diffraction of light L1 on the basis of the virtual center point cp. Thus, even when light introduced from an external source (hereinafter referred to as "external light") is reflected by the first pixel electrode 121, the organic light emitting display device according to an embodiment of the present inventive concept may omnidirectionally and uniformly induce diffraction of the reflected light L1. Accordingly, with the organic light emitting display device according to an embodiment of the present inventive concept, it is possible to alleviate color separation due to external light and visibility degradation due to external light reflection.

Referring to FIG. 4, an organic light emitting display device according to a comparative example includes a black matrix BMa having a rhombic opening BM_OP and a quadrangular color filter CFa. That is, the opening BM_OP of the black matrix BMa does not have uniform diffraction of light L2 on the basis of a virtual center point cpa. More specifically, the organic light emitting display device according to the comparative example has different diffraction of light L2 at a vertex a1 and a side a2 of the rhombic opening BM_OP of the black matrix. Thus, even when the external light is reflected, the organic light emitting display device according to the comparative example does not have uniform diffraction of light L2 (i.e., light L2 is biased in a certain direction), and thus color separation may be generated.

Figure 5:
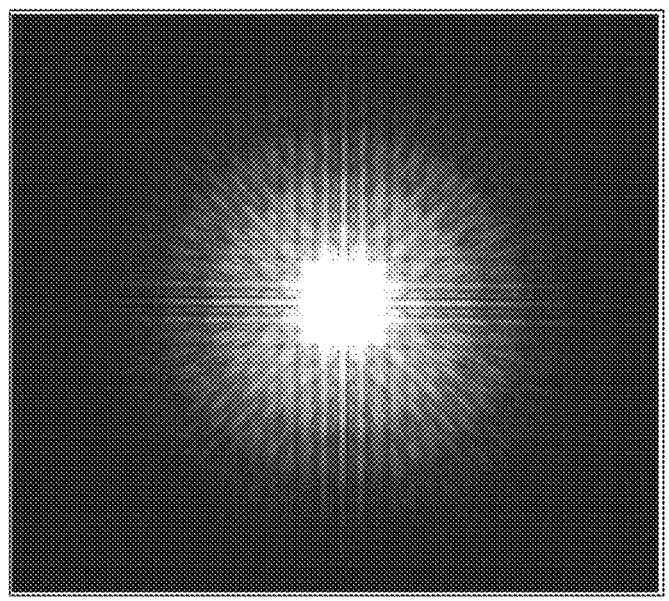
FIG. 5 is a view showing that color separation is alleviated in an organic light emitting display device according to an embodiment of the present inventive concept.
Figure 6:
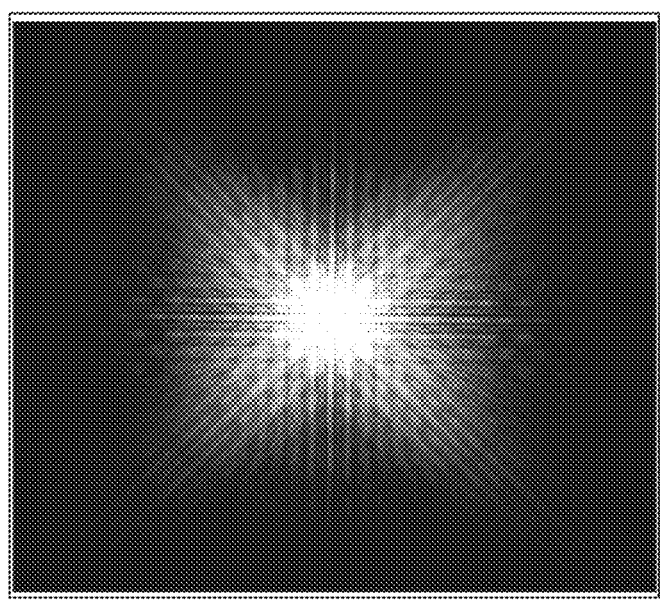
FIG. 6 is a view showing color separation in the organic light emitting display device according to the comparative example shown in FIG. 4.

FIG. 5 is a view showing that color separation is alleviated in an organic light emitting display device according to an embodiment of the present inventive concept. FIG. 6 is a view showing color separation of the organic light emitting display device according to the comparative example shown in FIG. 4.

It can be seen from FIG. 6 that color separation is generated in the form of a letter X in the organic light emitting display device according to the comparative example. On the other hand, it can be seen from FIG. 5 that color separation due to external light is alleviated by the organic light emitting display device according to an embodiment of the present inventive concept by omnidirectionally and uniformly inducing diffraction of light.

Meanwhile, the organic light emitting display device according to an embodiment of the present inventive concept does not include a polarizing plate. That is, the organic light emitting display device according to an embodiment of the present inventive concept can reduce reflection of external light without using the polarizing plate by using the color filter and the black matrix BM as disclosed in the embodiment. Also, it is possible to alleviate color separation by forming the opening BM_OP of the black matrix BMa in a circular shape.

Figure 7:
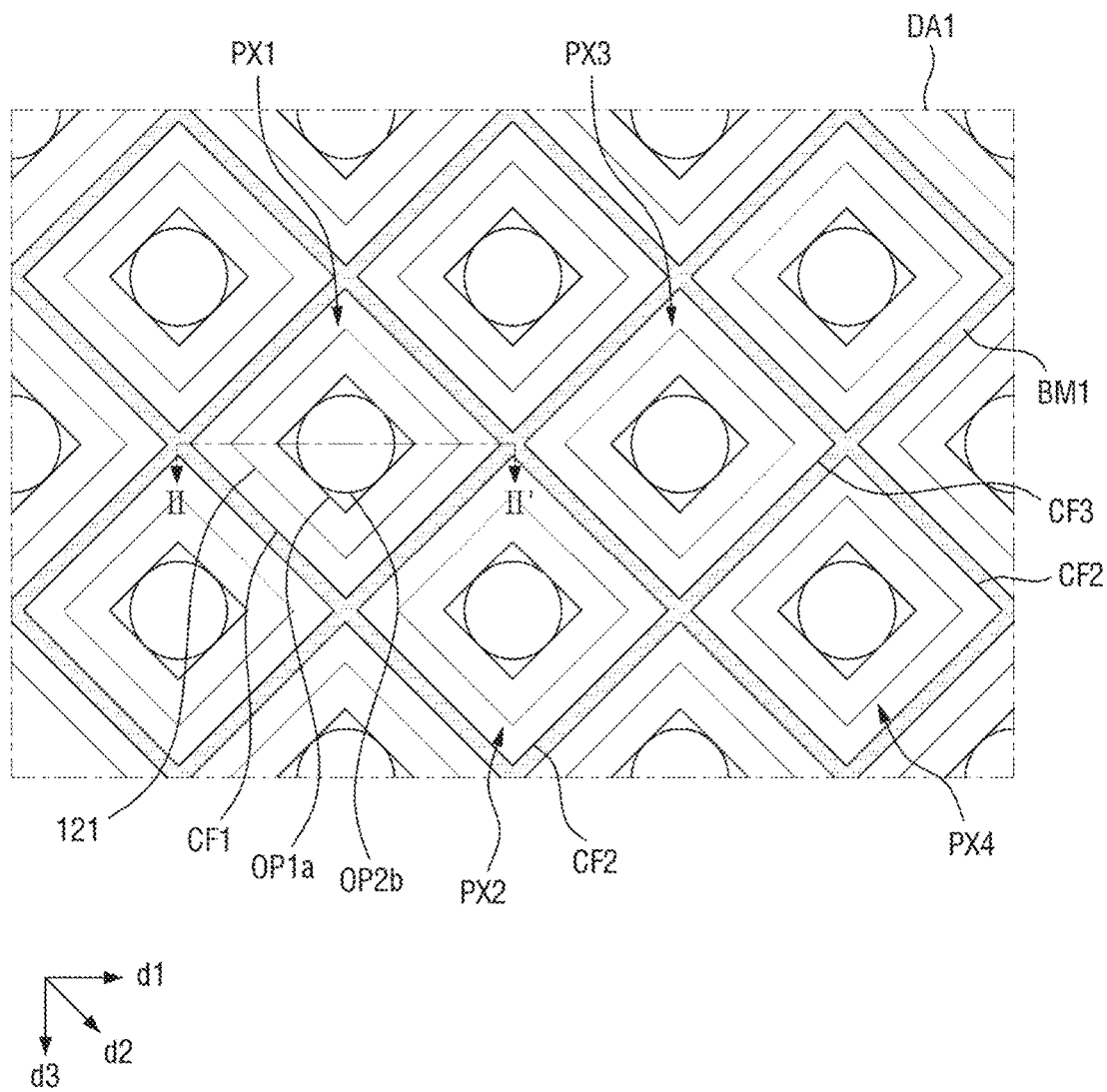
FIG. 7 is a plan view showing a pixel layout of an organic light emitting display device according to another embodiment of the present inventive concept.
Figure 8:
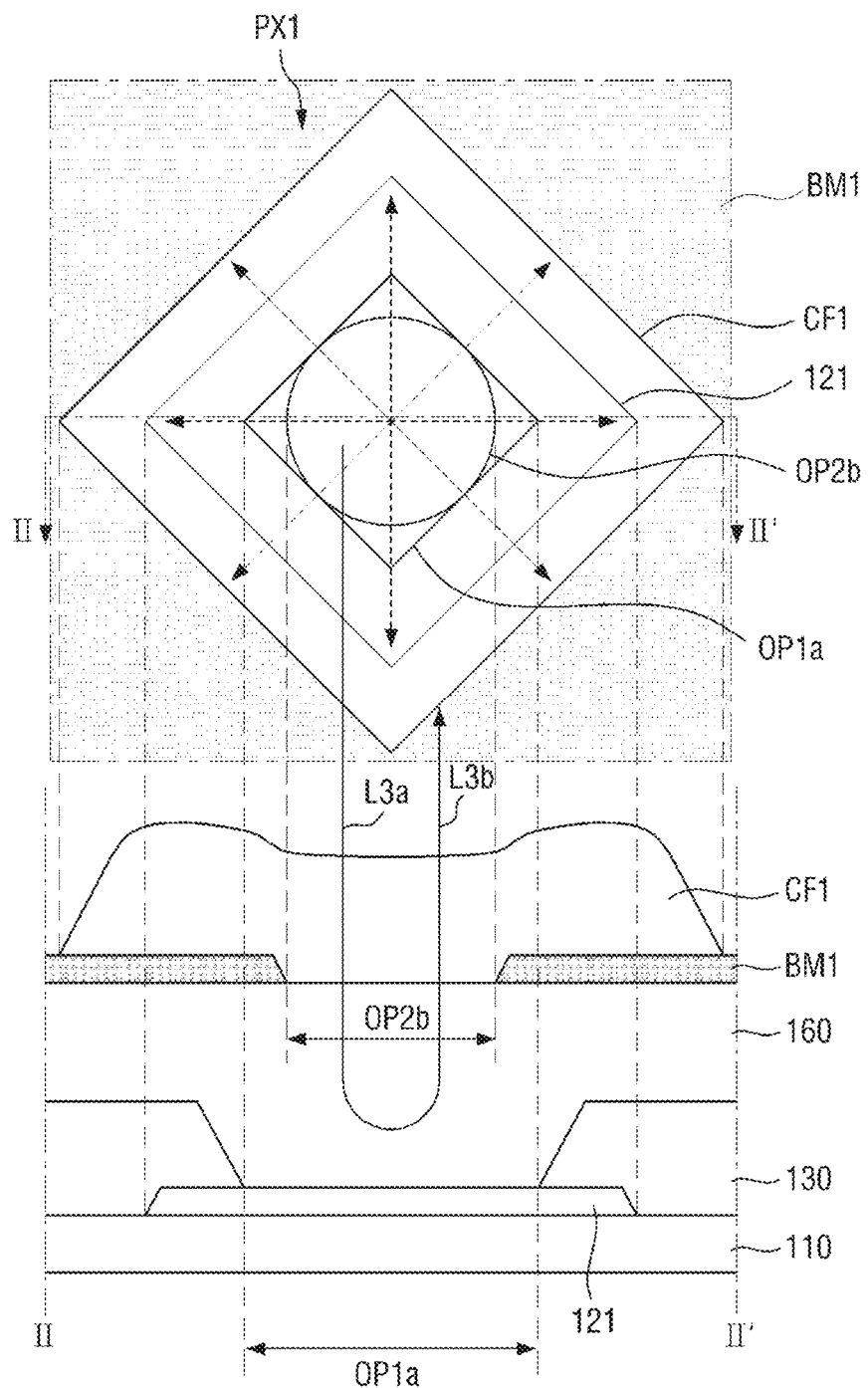
FIG. 8 is a sectional view taken along line II-II' shown in FIG. 7.

FIG. 7 is a plan view showing a pixel layout of an organic light emitting display device according to another embodiment of the present inventive concept. FIG. 8 is a sectional view taken along line II-II' shown in FIG. 7. For convenience of description, contents which are described in the foregoing embodiments with reference to FIGS. 1 to 6 will be omitted in the following description. The same reference numerals will be used for the same elements as those shown in FIGS. 1 to 6.

Referring to FIGS. 7 and 8, an opening OP2b of a black matrix BM1 has a smaller area than the opening OP1a of the pixel defining film 130. That is, the opening OP2b of the black matrix BM1 may fully overlap with a region of the first pixel electrode 121 exposed by the opening OP1a of the pixel defining film 130.

Accordingly, since the opening OP2b of the black matrix BM1 has a smaller area than the region of the first pixel electrode 121 exposed by the opening OP1a of the pixel defining film 130, external light L3a may have the same form as light L3b reflected by the first pixel electrode 121. Thus, the organic light emitting display device according to another embodiment of the present inventive concept may alleviate reflected color separation due to external light.

Also, the opening OP2b of the black matrix BM1 may have a circular shape. Thus, even when the external light L3a is reflected by the first pixel electrode 121, the organic light emitting display device may omnidirectionally and uniformly induce diffraction of the reflected light L3b. Thus, the organic light emitting display device according to another embodiment of the present inventive concept may alleviate color separation due to external light.

Meanwhile, as long as the opening OP2b of the black matrix BM1 has a smaller area than the opening OP1a of the pixel defining film 130, the shape of the opening OP2b of the black matrix BM1 is not limited to a circular shape. This will be described below in detail with reference to FIGS. 9A and 9B. For convenience of description in FIGS. 9A and 9B, the reference numerals of all the black matrices will be marked as "BM1."

Figure 9A:
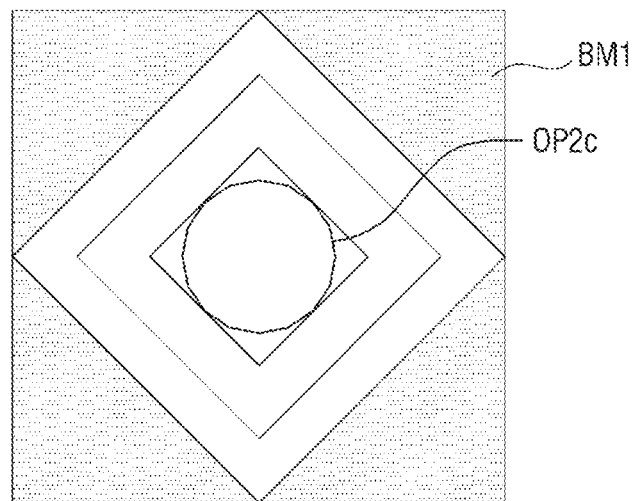
FIGS. 9A and 9B is a view showing examples of the shape of an opening of a black matrix shown in FIG. 7.
Figure 9B:
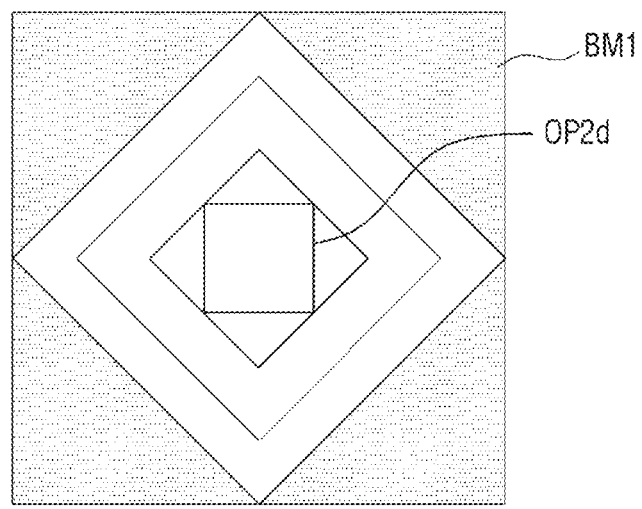

FIGS. 9A and 9B is a view showing examples of the shape of the opening of the black matrix shown in FIG. 7. Referring to FIG. 9A, an opening OP2c of the black matrix BM1 may have a polygonal shape close to a circular shape. Alternatively, referring to FIG. 9B, an opening OP2d of the black matrix BM1 may have a quadrangular shape.

The shape of the opening of the black matrix BM1 is not limited to those shown in FIGS. 8 and 9, and the opening of the black matrix BM1 may be formed in various shapes (such as an ellipse, a rhombus, and a parallelogram) in consideration of a required aperture ratio, required reflectivity, process conditions, and so on.

Also, a plurality of openings of the black matrix BM1 may have different shapes and areas. For example, the plurality of openings of the black matrix BM1 may have different shapes and areas depending on the type of an overlapping color filter. As an example, the diffraction degrees of wavelengths included in the external light (red>green>blue) and the brightness and lifespan of the organic light emitting layer are different. Thus, the shapes and areas of the plurality of openings of the black matrix BM1 may be determined in consideration of the difference. As an example, an opening overlapping with a green color filter among the plurality of openings of the black matrix BM1 may have relatively the smallest area.

Figure 10:
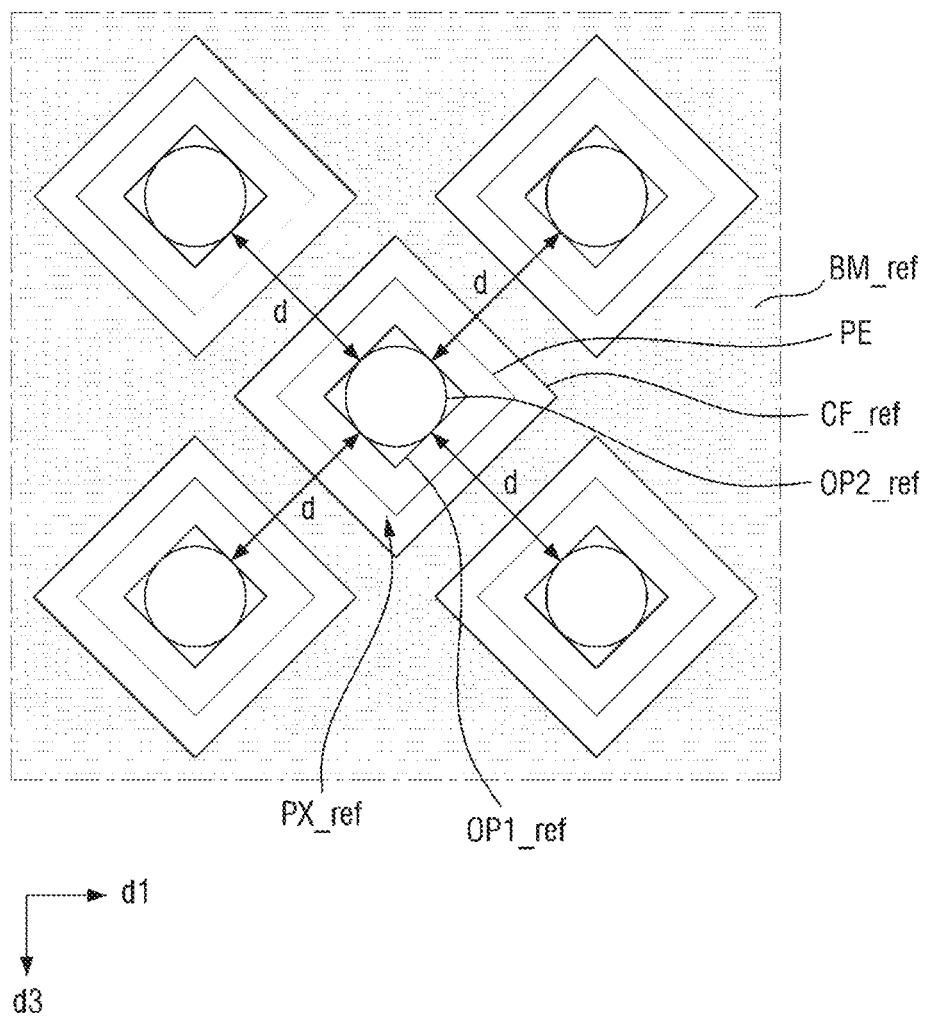
FIG. 10 is a view showing an interval between openings of a pixel defining film adjacent to an organic light emitting display device according to another embodiment of the present inventive concept.

FIG. 10 is a view showing an interval between openings of a pixel defining film adjacent to an organic light emitting display device according to another embodiment of the present inventive concept. The following description with reference to FIG. 10 is based on a reference pixel PX_ref overlapping with a reference color filter CF_ref.

Referring to FIG. 10, an opening OP2_ref of a black matrix BM_ref has a smaller area than an opening OP1_ref of a pixel defining film. That is, the opening OP2_ref of the black matrix BM_ref may fully overlap with a region of a pixel electrode PE exposed by the opening OP1_ref of the pixel defining film.

Thus, since the opening OP2_ref of the black matrix BM_ref has a smaller area than the pixel electrode PE capable of reflecting external light, the external light and light reflected by the pixel electrode PE may have the same form. Also, the opening OP2b_ref of the black matrix BM_ref may have a circular shape. Accordingly, the organic light emitting display device according to another embodiment of the present inventive concept may alleviate reflected color separation due to external light.

Referring to FIG. 10, shortest distances d between the opening OP1_ref of the pixel defining film for exposing the pixel electrode PE and openings of adjacent pixel defining films may be the same as each other. Here, openings adjacent in a first direction d1 and a third direction d3 with reference to FIG. 10 are excluded from the openings of the adjacent pixel defining films.

When the shortest distances d between the opening OP1_ref of the pixel defining film for exposing the pixel electrode PE and openings of adjacent pixel defining films are different from each other, color crosstalk may occur between two adjacent pixels having a relatively small shortest distance d. As a result, colors in the two adjacent pixels may be mixed with each other.

With the organic light emitting display device shown in FIG. 10, the shortest distances d between the opening OP1_ref of the pixel defining film for exposing the pixel electrode PE and openings of adjacent pixel defining films may be the same, and thus it is possible to alleviate color crosstalk between adjacent pixels. As another example, in addition to the case where the opening OP2_ref of the black matrix BM_ref has a smaller area than the opening OP1_ref of the pixel defining film (i.e., even when the area of the opening OP2_ref of the black matrix BM_ref is larger than or equal to the area of the opening OP1_ref of the pixel defining film), the shortest distances d between the opening OP1_ref of the pixel defining film and openings of adjacent pixel defining films may be the same.

Figure 11:
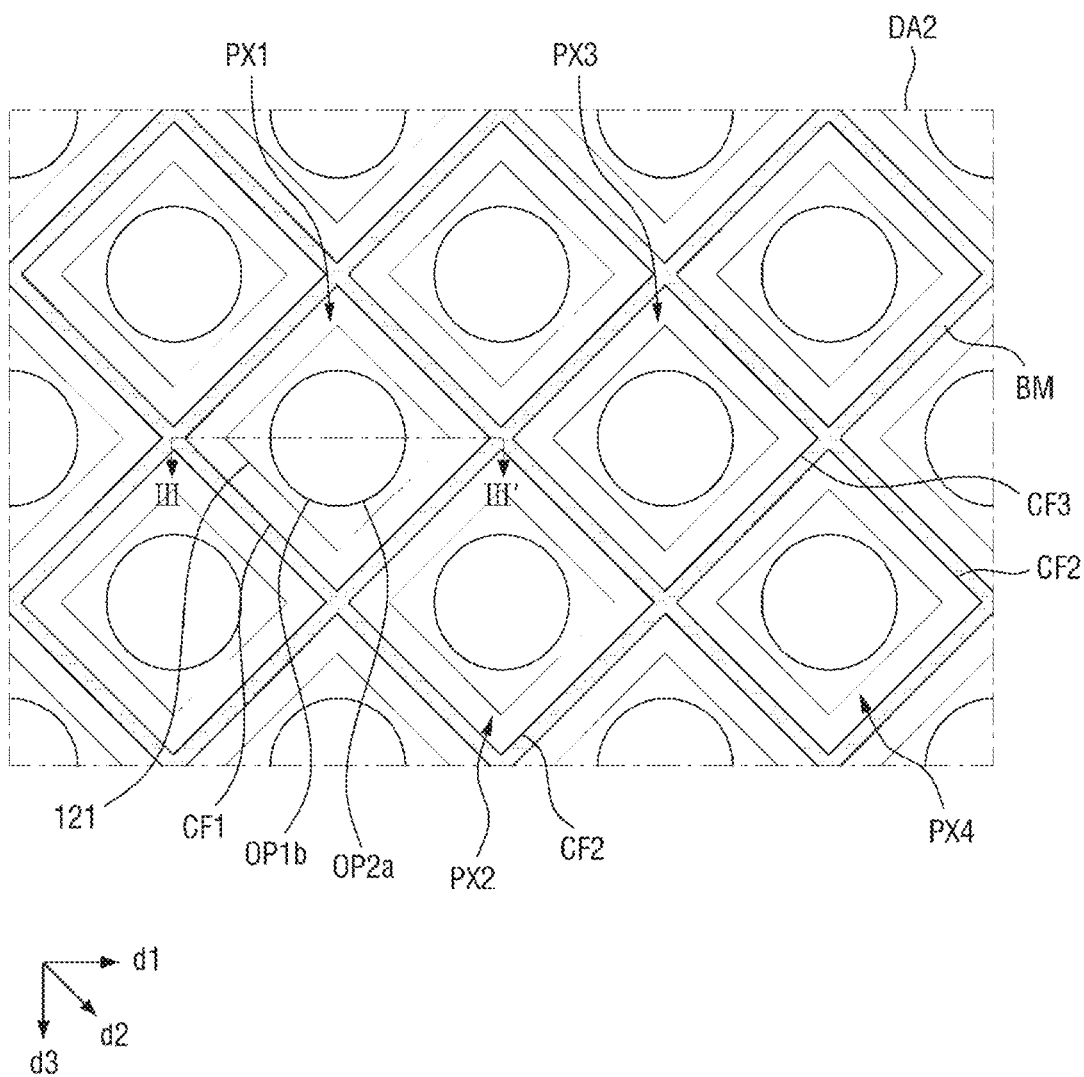
FIG. 11 is a plan view showing a pixel layout of an organic light emitting display device according to another embodiment of the present inventive concept.
Figure 12:
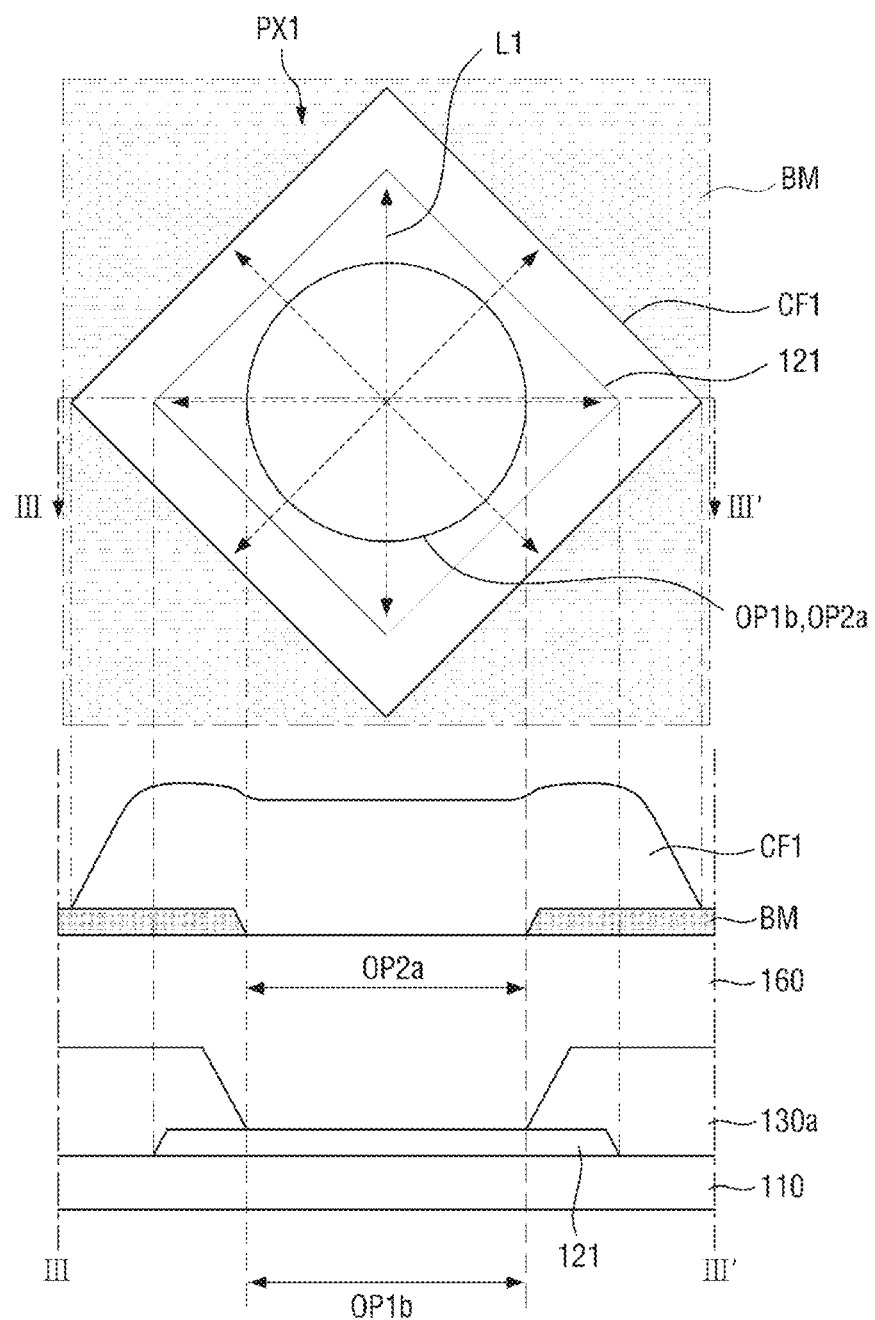
FIG. 12 is a sectional view taken along line shown in FIG. 11.

FIG. 11 is a plan view showing a pixel layout of an organic light emitting display device according to another embodiment of the present inventive concept. FIG. 12 is a sectional view taken along line shown in FIG. 11. However, duplicate content of the foregoing description with reference to FIGS. 1 to 10 will be omitted in the following description.

Referring to FIGS. 11 and 12, an opening OP1b of a pixel defining film 130a may have a circular shape. Also, an opening OP2a of a black matrix BM may have a substantially circular shape. That is, the opening OP1b of the pixel defining film 130a and the opening OP2a of the black matrix BM have circular shapes, and thus it is possible to omnidirectionally disperse light L1 reflected by a first pixel electrode 121. That is, the organic light emitting display device according to another embodiment of the present inventive concept may omnidirectionally and uniformly induce diffraction of the light L1 reflected by the first pixel electrode 121, and thus it is possible to alleviate color separation due to external light and visibility degradation due to reflection of external light.

Meanwhile, in FIGS. 11 and 12, the opening OP1b of the pixel defining film 130a and the opening OP2a of the black matrix BM are shown as having the same area, but are not limited thereto. As an example, the opening OP2a of the black matrix BM may have a smaller area than the opening OP1b of the pixel defining film 130a. Thus, the external light and the light reflected by the first pixel electrode 121 may have the same form.

Figure 13:
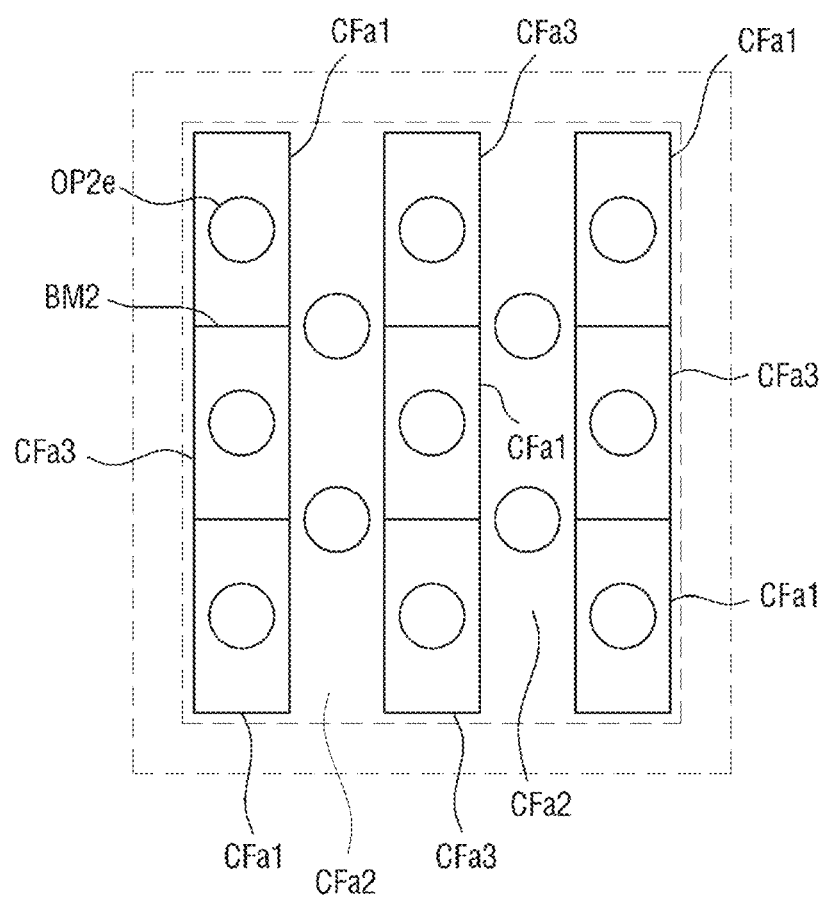
FIG. 13 is a plan view showing an opening of a black matrix and a color filter of an organic light emitting display device according to another embodiment of the present inventive concept.

FIG. 13 is a plan view showing an opening of a black matrix and a color filter of an organic light emitting display device according to another embodiment of the present inventive concept. For convenience of description, the remaining elements other than a color filter and an opening of a black matrix will be omitted in FIG. 13.

Referring to FIG. 13, a first color filter CFa1 and a third color filter CFa3 may have a quadrangular shape. A second color filter CFa2 may be formed overall along the same column, other than an opening OP2e of a black matrix BM2.

Here, as an example, the first color filter CFa1 may be a red color filter, and the second color filter CFa2 may be a green color filter. Also, as an example, the third color filter CFa3 may be a blue color filter. Locations of the first color filter CFa1 and the third color filter CFa3 may be exchangeable with each other.

That is, the organic light emitting display device according to another embodiment of the present inventive concept shown in FIG. 13 is different from the organic light emitting display device according to an embodiment shown in FIG. 1 in terms of the shapes of the color filters. However, even in this case, the opening OP2e of the black matrix BM2 may have a circular shape.

Thus, even when external light is reflected by a plurality of pixel electrodes, it is possible to omnidirectionally and uniformly induce diffraction of the reflected light. Accordingly, with the organic light emitting display device according to another embodiment of the present inventive concept, it is possible to alleviate color separation due to external light and visibility degradation due to external light reflection.

Figure 14:
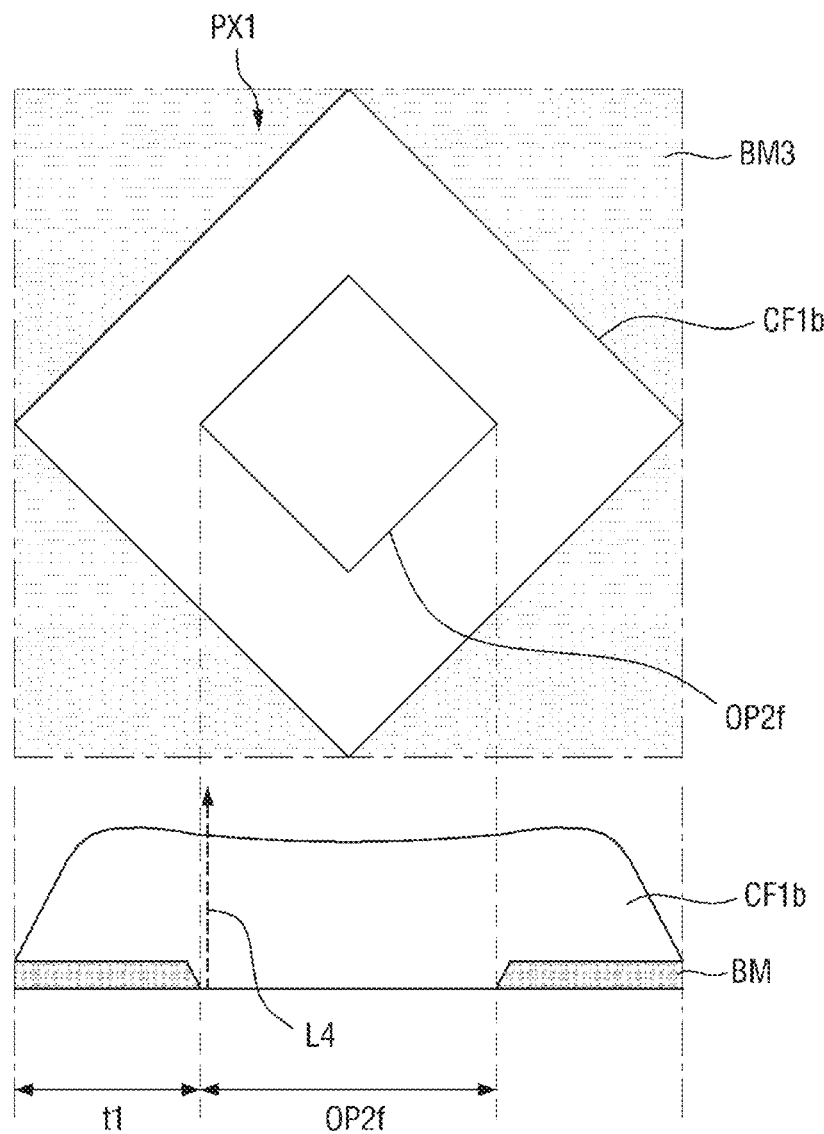
FIG. 14 is a plan view showing an opening of a black matrix and a color filter of an organic light emitting display device according to still another embodiment of the present inventive concept.
Figure 15:
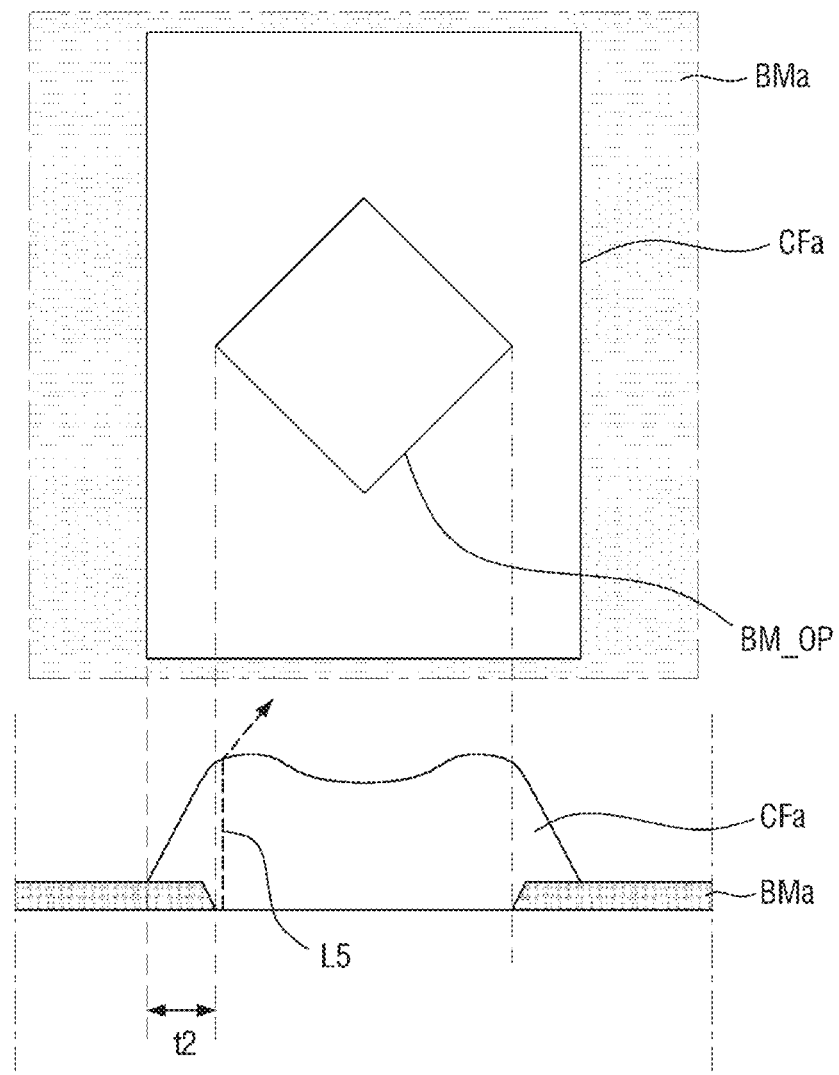
FIG. 15 is a plan view showing a color filter and an opening of a black matrix of an organic light emitting display device according to a comparative example.

FIG. 14 is a plan view showing an opening of a black matrix and a color filter of an organic light emitting display device according to still another embodiment of the present inventive concept. FIG. 15 is a plan view showing a color filter and an opening of a black matrix of an organic light emitting display device according to a comparative example. For convenience of description, only a black matrix, an opening of the black matrix, and a color filter have been shown in FIGS. 14 and 15.

Referring to FIG. 14, a color filter CF1b may sufficiently overlap with a black matrix BM3. Thus, light L4 reflected through a pixel electrode or the like may minimize diffraction in a side portion (an edge region) of the color filter CF1b. As an example, an overlap distance t1 between the color filter CF1b and the black matrix BM3 may range from about 6 μm to about 12 μm.

On the other hand, referring to FIG. 15, an organic light emitting display device according to a comparative example includes a black matrix BMa having a rhombic opening BM_OP and a quadrangular color filter CFa. That is, the organic light emitting display device according to the comparative example has a short overlap distance t2 between the color filter CFa and the black matrix BMa. Thus, diffraction of reflected light L5 may occur in a side portion of the color filter CFa. When the diffraction of the reflected light L5 occurs, color separation and visibility degradation may occur.

Meanwhile, as long as the color filter CF1b sufficiently overlaps with the black matrix BM3, an opening OP2f of the black matrix BM3 need not have the same shape as the color filter CF1b.

Even when the opening of the black matrix BM3 has a circular shape, the overlap distance t1 between the color filter CF1b and the black matrix BM3 may range, for example, from about 6 μm to about 12 μm.

Figure 16:
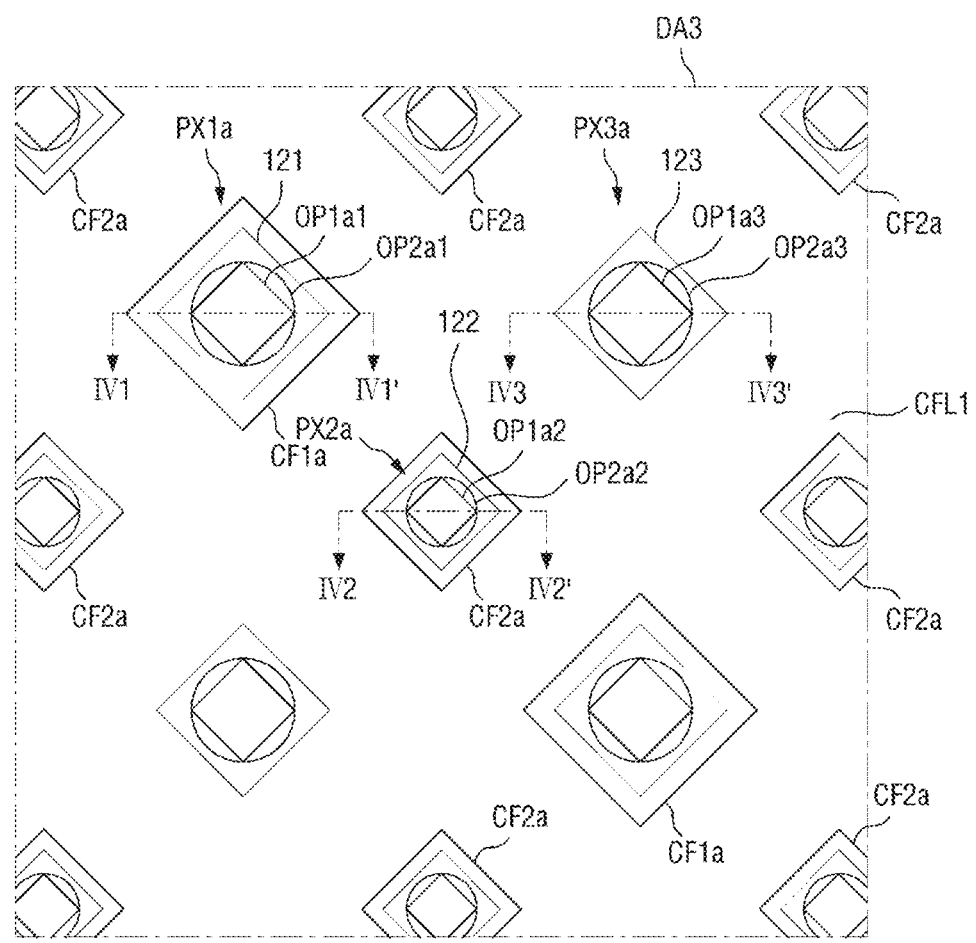
FIG. 16 is a plan view showing a pixel layout of an organic light emitting display device according to another embodiment of the present inventive concept.
Figure 17:
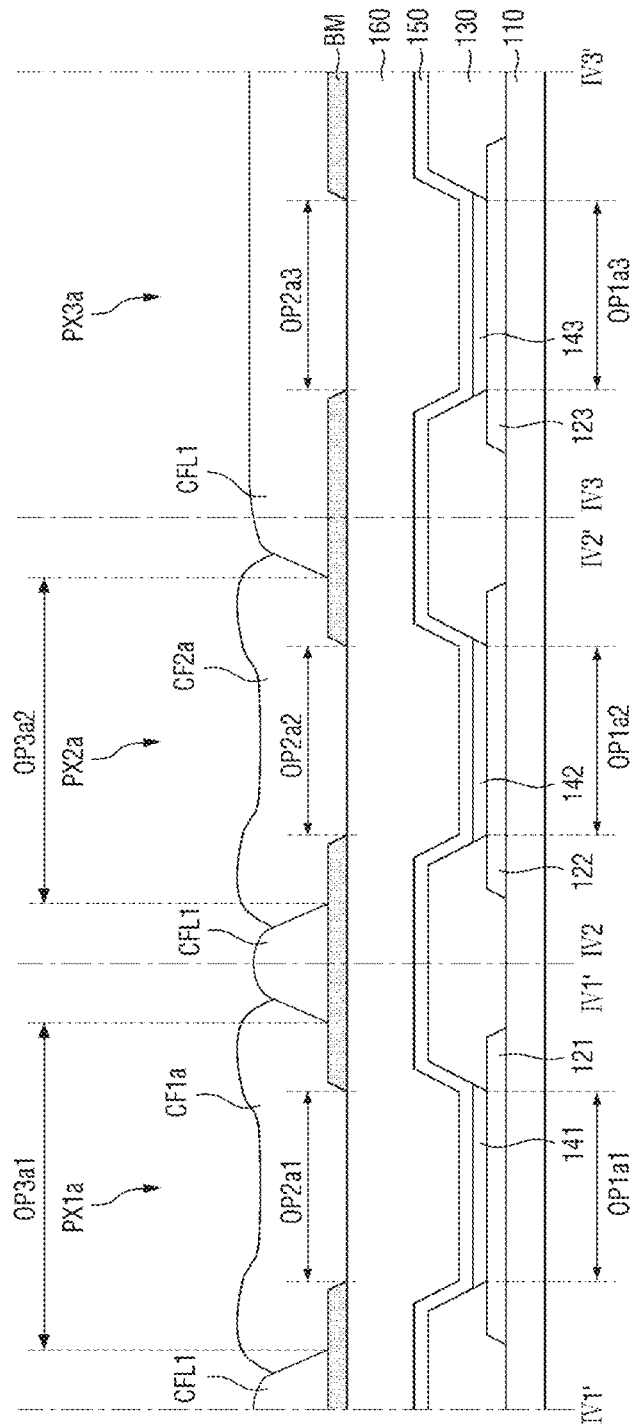
FIG. 17 is a sectional view taken along line IV1-IV1', line IV2-IV2', and line IV3-IV3' shown in FIG. 16.

FIG. 16 is a plan view showing a pixel layout of an organic light emitting display device according to another embodiment of the present inventive concept. FIG. 17 is a sectional view taken along line IV1-IV1', line IV2-IV2', and line IV3-IV3' shown in FIG. 16. In FIGS. 16 and 17, a first pixelPX1a, a second pixel PX2a, and a third pixel PX3a will be described as an example. However, duplicate content of the foregoing description with reference to FIGS. 1 to 15 will be omitted in the following description. Also, an opening of a first color filter layer CFL1 will not be shown in FIG. 16 in order to avoid confusion with other elements.

Referring to FIGS. 16 and 17, the first color filter layer CFL1 may be disposed on a black matrix BM. The first color filter layer CFL1 may include a plurality of openings having a first opening OP3a1 and a second opening OP3a2. Also, the first color filter layer CFL1 overlaps with a third organic light emitting layer 143, an opening OP1a3 of a pixel defining film 130, and an opening OP2a3 of the black matrix BM. That is, the first color filter layer CFL1 may be disposed on the black matrix BM to cover an entire surface of the black matrix BM except regions of the plurality of openings.

More specifically, the first color filter layer CFL1 may be formed to surround openings OP2a1 and OP2a2 of the black matrix BM when viewed from the top.

As an example, the first color filter layer CFL1 may be a blue color filter layer selectively transmitting blue light. Thus, the third pixel PX3a may display a blue color.

A first color filter CF1a may be disposed on the first color filter layer CFL1. The first color filter CF1a may overlap with a first organic light emitting layer 141, an opening OP1a1 of the pixel defining film 130, and the opening OP2a1 of the black matrix BM. As an example, the first color filter CF1a may be a red color filter selectively transmitting red light. Thus, the first pixel PX1a may display a red color.

A second color filter CF2a may be disposed on the first color filter layer CFL1. The second color filter CF2a may overlap with a second organic light emitting layer 142, an opening OP1a2 of the pixel defining film 130, and the opening OP2a2 of the black matrix BM. As an example, the second color filter CF2a may be a green color filter selectively transmitting green light. Thus, the second pixel PX2a may display a green color.

The first color filter CF1a and the second color filter CF2a are not formed overall on the black matrix BM, unlike the first color filter layer CFL1.

Figure 18:
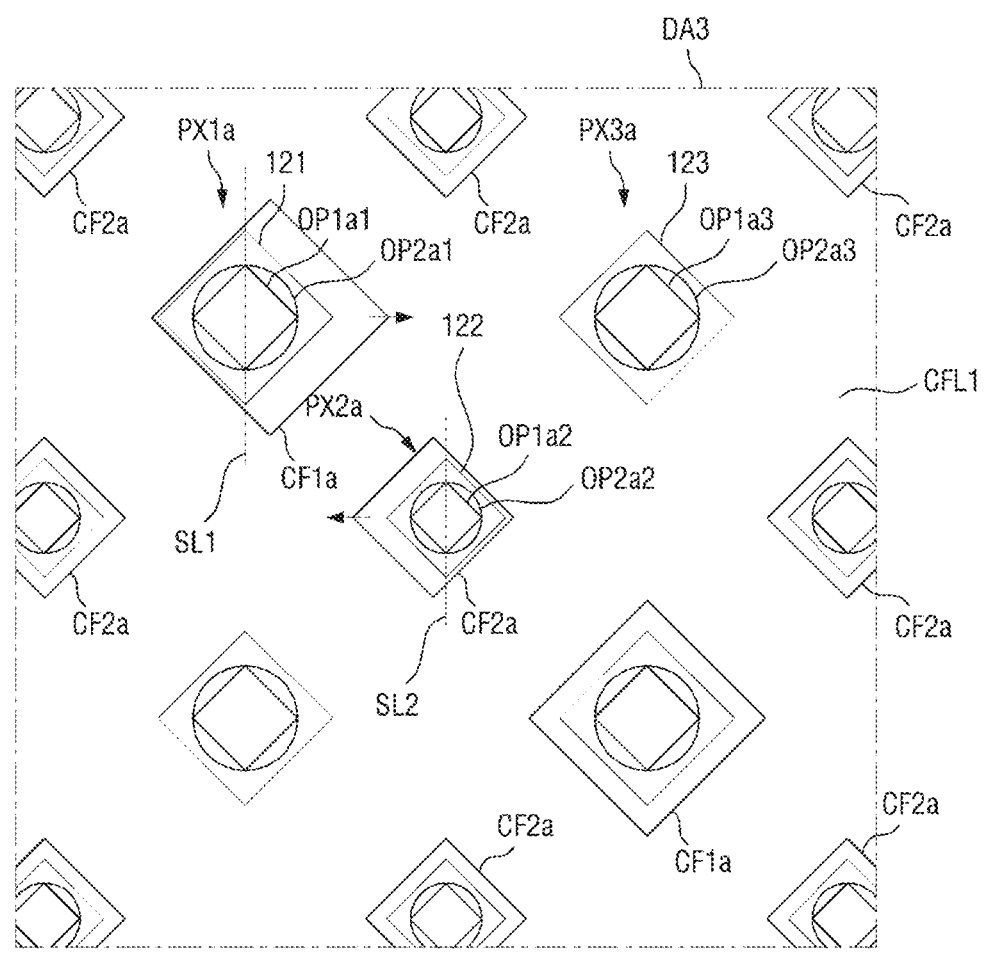
FIG. 18 is a diagram illustrating an improvement of reflective dispersion of the organic light emitting display device shown in FIG. 16.
Figure 19:
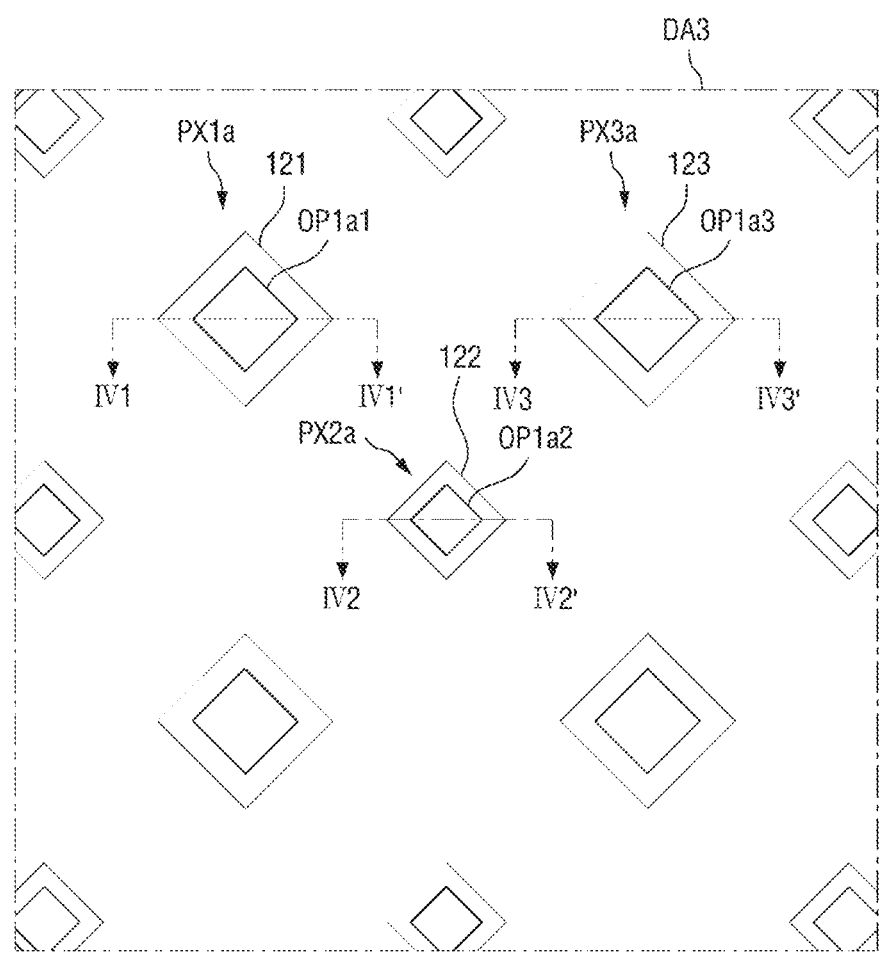
FIGS. 19, 20, 21, 22, 23, 24, 25 and 26 are diagrams illustrating a process of manufacturing the organic light emitting display device shown in FIG. 16.
Figure 20:
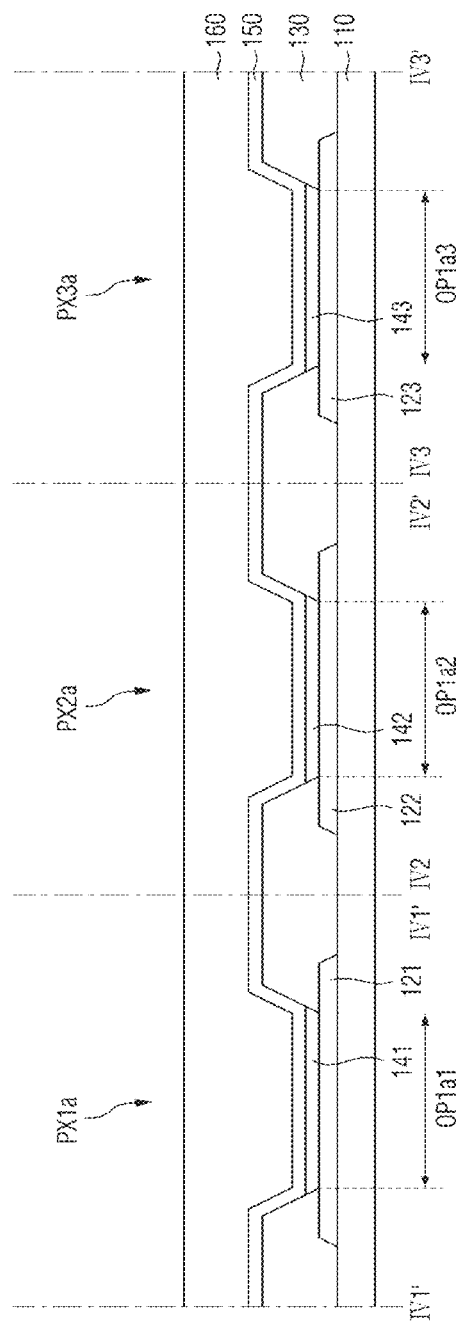
Figure 21:
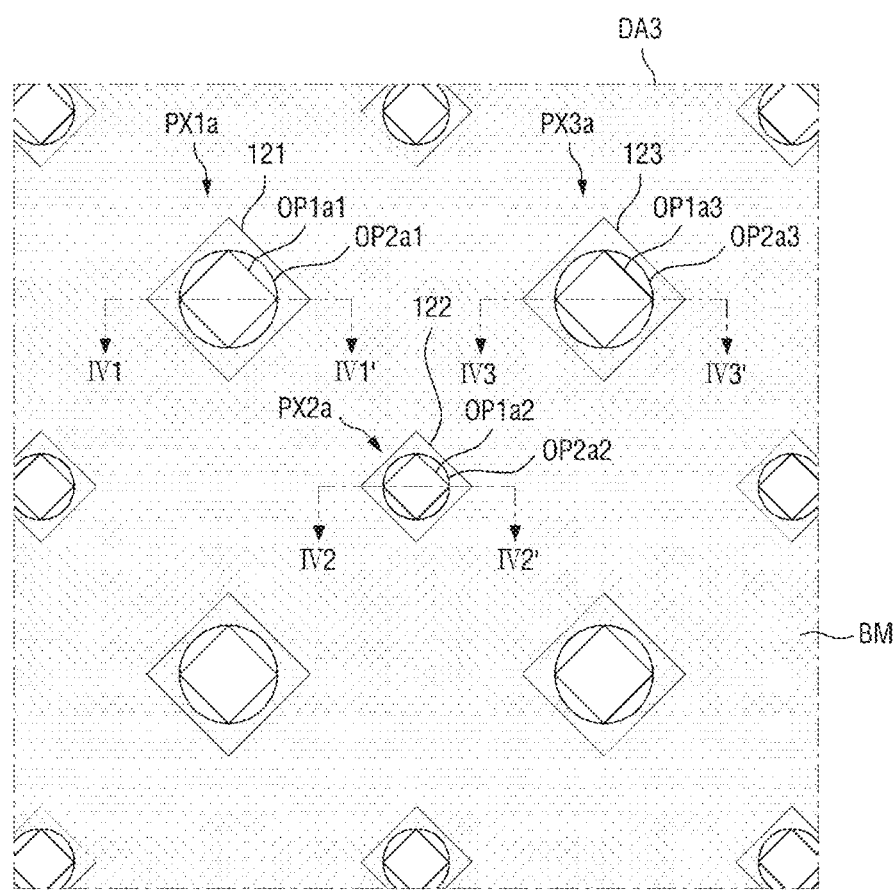
Figure 22:
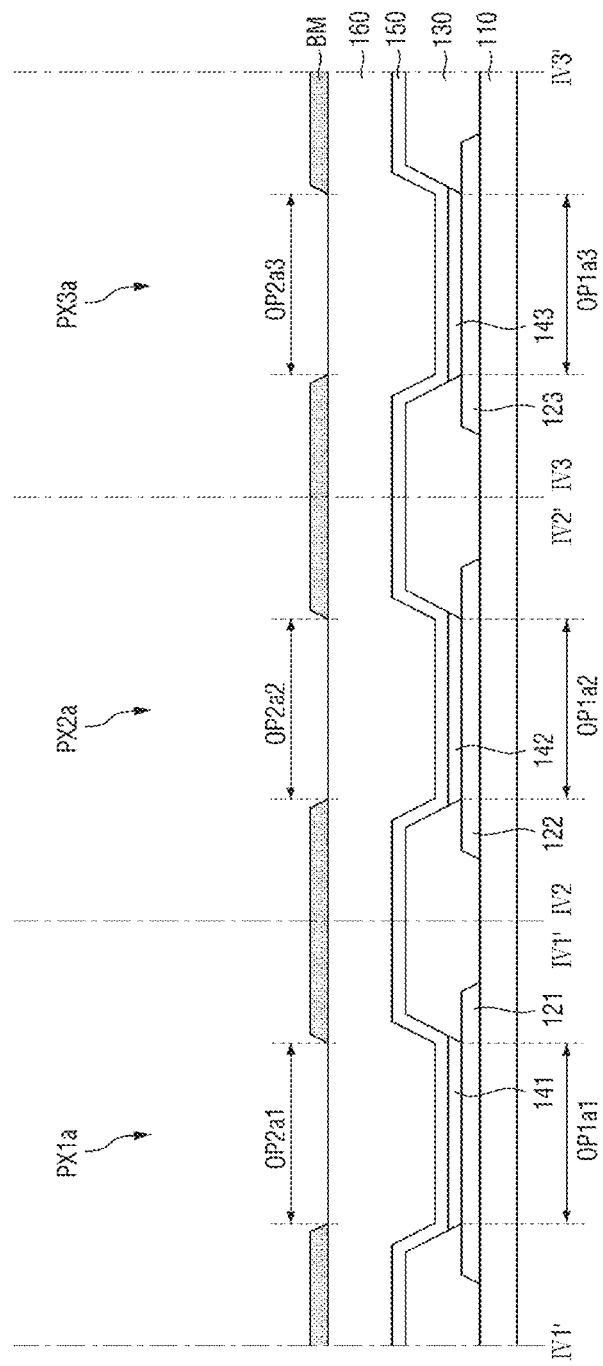

FIG. 18 is a diagram illustrating an improvement of reflective dispersion of the organic light emitting display device shown in FIG. 16.

Referring to FIGS. 16 to 18, after the first color filter layer CFL1 is formed, the first color filter CF1a and the second color filter CF2a are formed on the first color filter layer CFL1. The first color filter layer CFL1 is formed overall on the black matrix BM, and the first color filter CF1a and the second color filter CF2a are formed in an island shape to at least partially overlap with the first color filter layer CFL1. Thus, the black matrix BM may not include an exposed region. Thus, even when at least one of the first color filter CF and the second color filter CF2a is misaligned with respect to a center line SL1 or SL2 during a process an exposed area of the black matrix BM may be maintained at a constant value because the first color filter layer CFL1 is formed to cover an entire surface of the black matrix BM except regions of the plurality of openings. Here, the degree to which the first color filter CF1a and the first color filter layer CFL1 overlap with each other and the degree to which the second color filter CF2a and the first color filter layer CFL1 overlap with each other may be determined in consideration of color crosstalk and design margins.

That is, since the first color filter layer CFL1 is formed to cover an entire surface of the black matrix BM except regions of the plurality of openings, a region in which the first color filter layer CFL1 and the black matrix BM are exposed may be maintained in a displayed region DA3 although at least one of the first color filter CF1a and the second color filter CF2a is misaligned with respect to the center line SL1 or SL2.

When an area in which the black matrix BM is exposed is different for each location during the process, a dispersion imbalance may occur for each location. This also means that reflectivity of external light may change for each location.

With the organic light emitting display device according to another embodiment of the present inventive concept, it is possible to alleviate a dispersion imbalance and a reflectivity difference for each region by maintaining the region in which the first color filter layer CFL1 and the black matrix BM are exposed in the displayed region DA3.

The openings OP2a1, OP2a2, and OP2a3 of the black matrix BM may have a circular shape. That is, since the openings OP2a1, OP2a2, and OP2a3 of the black matrix BM have a circular shape, the organic light emitting display device may omnidirectionally and uniformly induce light diffraction. Thus, even when external light is reflected by first to third pixel electrodes 121 to 123, the organic light emitting display device may omnidirectionally and uniformly induce light diffraction. Accordingly, with the organic light emitting display device according to another embodiment of the present inventive concept, it is possible to alleviate color separation due to external light and visibility degradation due to external light reflection.

FIGS. 19 to 26 are diagrams illustrating a process of manufacturing the organic light emitting display device shown in FIG. 16. However, duplicate content of the foregoing description with reference to FIGS. 16 to 18 will be omitted in the following description.

Referring to FIGS. 19 to 22, a black matrix BM may be formed on an encapsulation layer 160. The black matrix BM may be disposed on the encapsulation layer 160 except regions of a plurality of openings including openings OP2a1, OP2a2, and OP2a3. A material with high absorption for visible light may be used for the black matrix BM. Although not shown, a buffer layer or an organic layer may be formed between the black matrix BM and the encapsulation layer 160. The buffer layer or the organic layer may be formed in a single-layered structure or a multi-layered structure.

Figure 23:
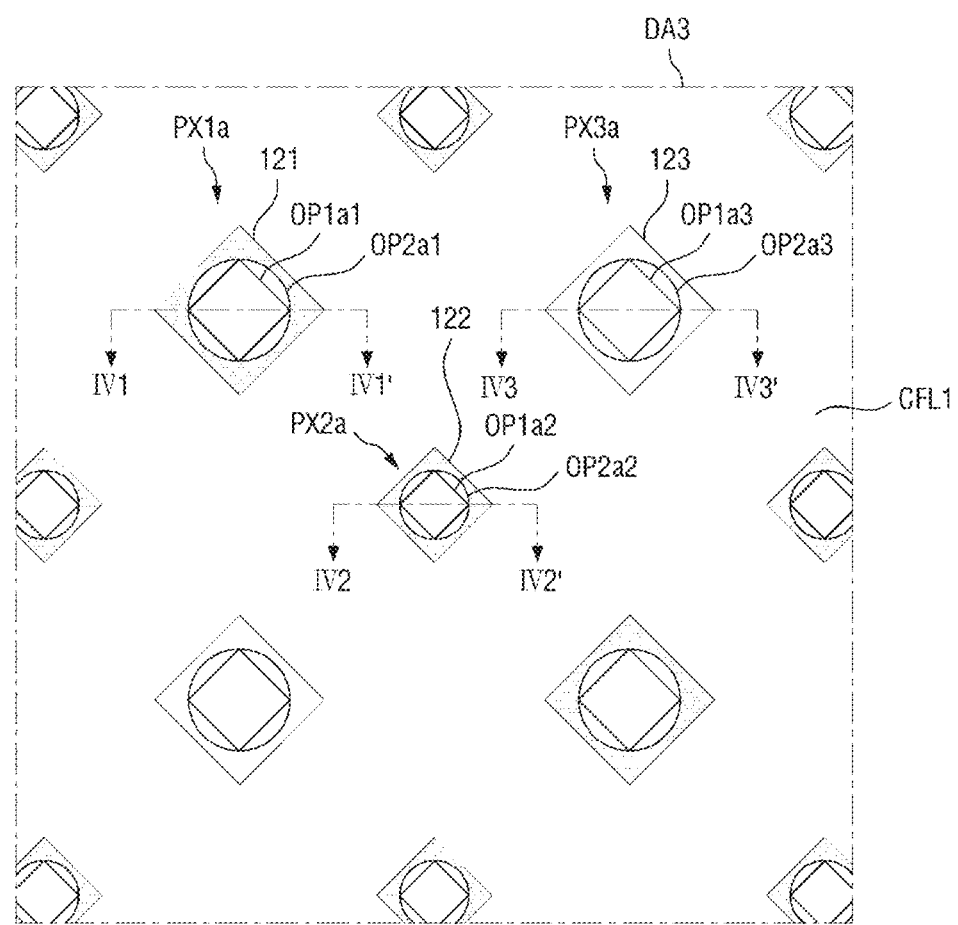
Figure 24:
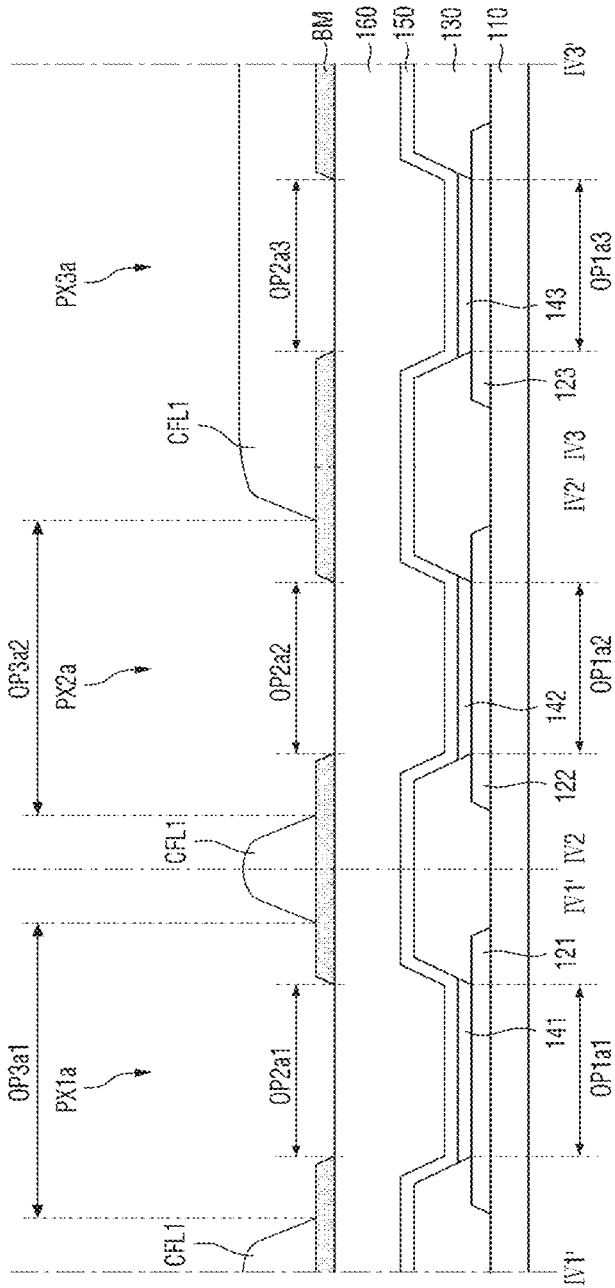

Referring to FIGS. 23 and 24, a first color filter layer CFL1 may be disposed on the black matrix BM. The first color filter layer CFL1 may be formed overall on the black matrix BM except regions of a plurality of openings having a first opening OP3a1 and a second opening OP3a2.

Figure 25:
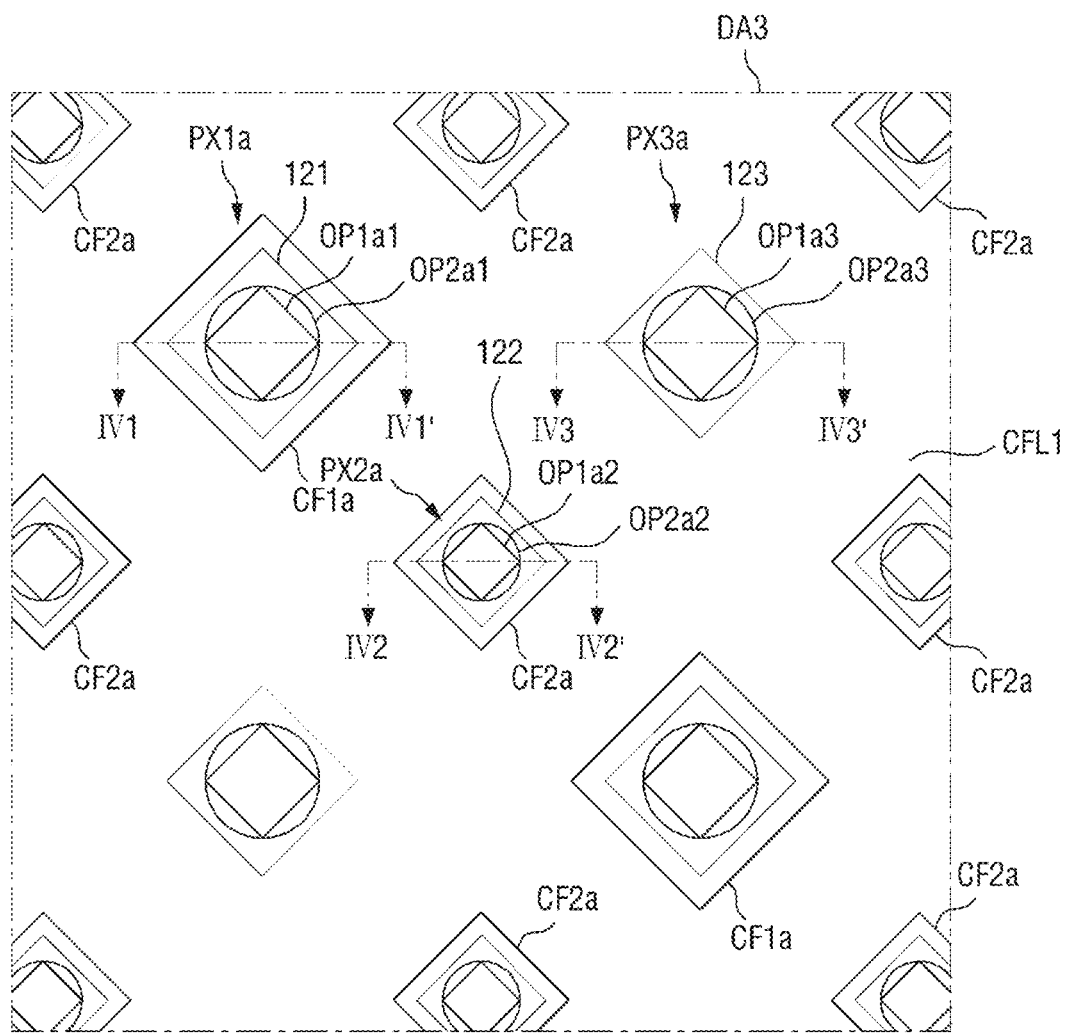
Figure 26:
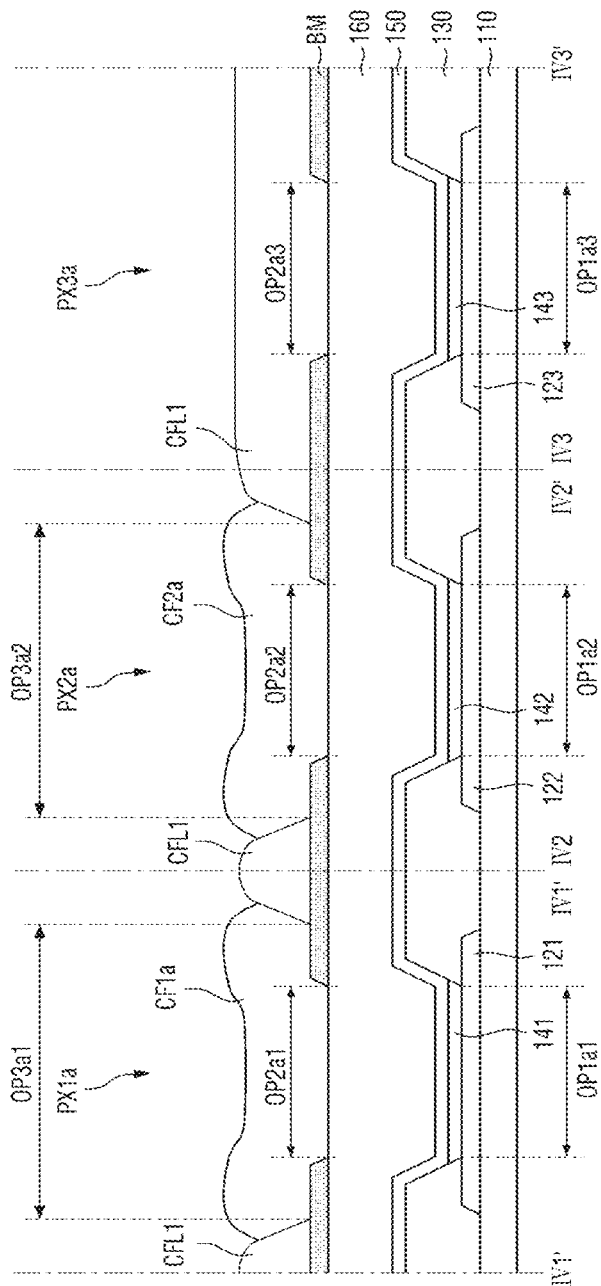

Referring to FIGS. 25 and 26, a first color filter CF1a and a second color filter CF2a may be sequentially formed on the first color filter layer CFL1. The first color filter CF1a may be formed to cover the first opening OP3a1 of the first color filter layer CFL1. The second color filter CF2a may be formed to cover the second opening OP3a2 of the first color filter layer CFL1. The order in which the first color filter CF1a and the second color filter CF2a are formed is not particularly limited.

A method of forming the first color filter layer CFL1, the first color filter CF1a, and the second color filter CF2a is not particularly limited. For example, the first color filter layer CFL1, the first color filter CF1a, and the second color filter CF2a may be formed through a photo lithography process or an inkjet process. Also, the first color filter layer CFL1, the first color filter CF1a, and the second color filter CF2a need not be formed through the same process. For example, the first color filter layer CFL1 may include a polymer material as the first color filter layer CFL1 is formed through the photo process. Thus, the first color filter CF1a and the second color filter CF2a may include an ink material as the first color filter CF1a and the second color filter CF2a are formed through the inkjet process.

An organic light emitting display device having a low-reflection and no-change structure according to another embodiment will be described below with reference to FIGS. 27 to 30. For comparison with FIG. 17, the following description will be provided with reference to the sectional views of FIGS. 27 to 30. However, duplicate content of the foregoing description with reference to FIGS. 16 to 26 will be omitted in the following description.

Figure 27:
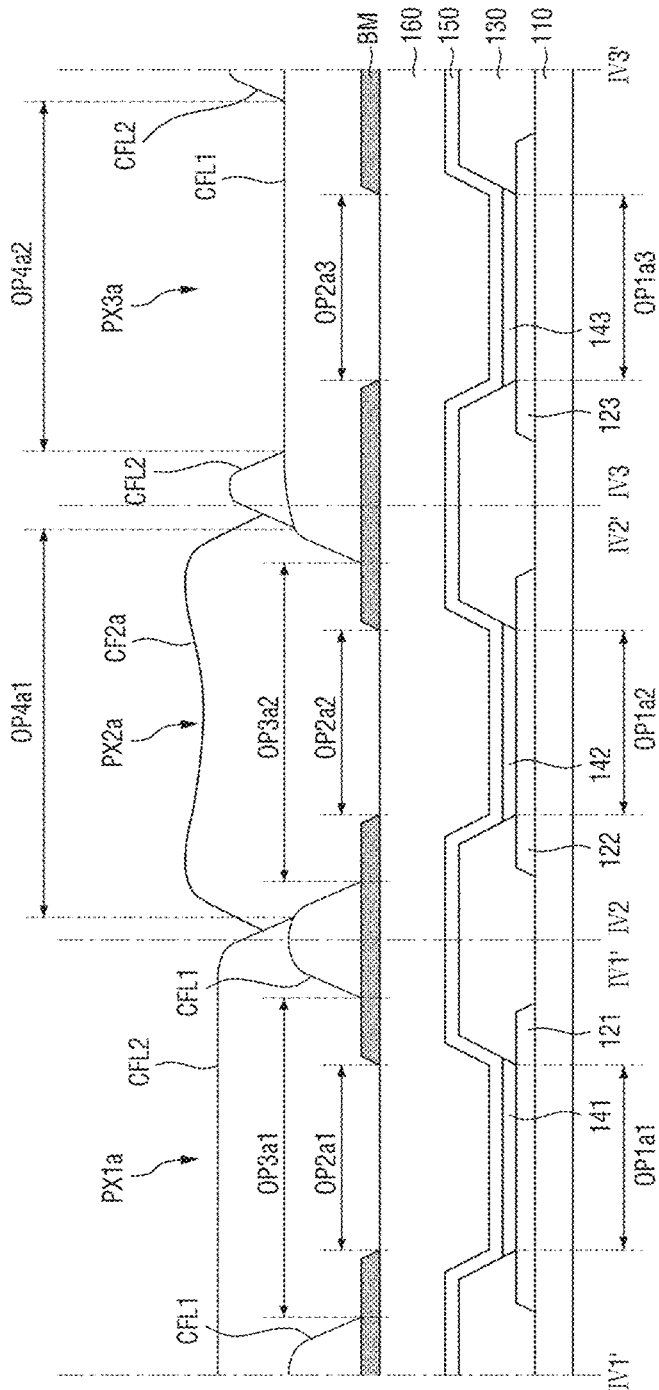
FIG. 27 is a sectional view showing an organic light emitting display device according to another embodiment of the present inventive concept.

FIG. 27 is a sectional view showing an organic light emitting display device according to another embodiment of the present inventive concept.

Referring to FIG. 27, a second color filter layer CFL2 may be disposed on a first color filter layer CFL1. The second color filter layer CFL2 may include a plurality of openings having a first opening OP4a1 and a second opening OP4a2. Also, the second color filter layer CFL2 overlaps with a first organic light emitting layer 141, an opening OP1a1 of a pixel defining film 130, and an opening OP2a1 of a black matrix BM. That is, the second color filter layer CFL2 may be formed to cover an entire surface of the first color filter layer CFL1 except regions of the plurality of openings having a first opening OP4a1 and a second opening OP4a2.

More specifically, the second color filter layer CFL2 may be formed to surround openings OP2a2 and OP2a3 of the black matrix BM when viewed from the top. In other words, the second color filter layer CFL2 may be formed to surround openings OP3a1 and OP3a2 of the first color filter layer CFL1 when viewed from the top.

That is, the second color filter layer CFL2 is formed to cover an entire surface of the first color filter layer CFL1 except regions of the second opening OP4a2. At this point, the second color filter layer CFL2 covers the opening OP2a1 of the black matrix BM. As an example, the second color filter layer CFL2 may be a red color filter layer selectively transmitting red light. Thus, a first pixel PX1a may display a red color.

A second color filter CF2a may be disposed on the second color filter layer CFL2. The second color filter CF2a may overlap with a second organic light emitting layer 142, an opening OP1a2 of the pixel defining film 130, and the opening OP2a2 of the black matrix BM. As an example, the second color filter CF2a may be a green color filter selectively transmitting green light. Thus, a second pixel PX2a may display a green color.

That is, the organic light emitting display device shown in FIG. 27 may include the second color filter layer CFL2 instead of the first color filter CF1a.

Figure 28:
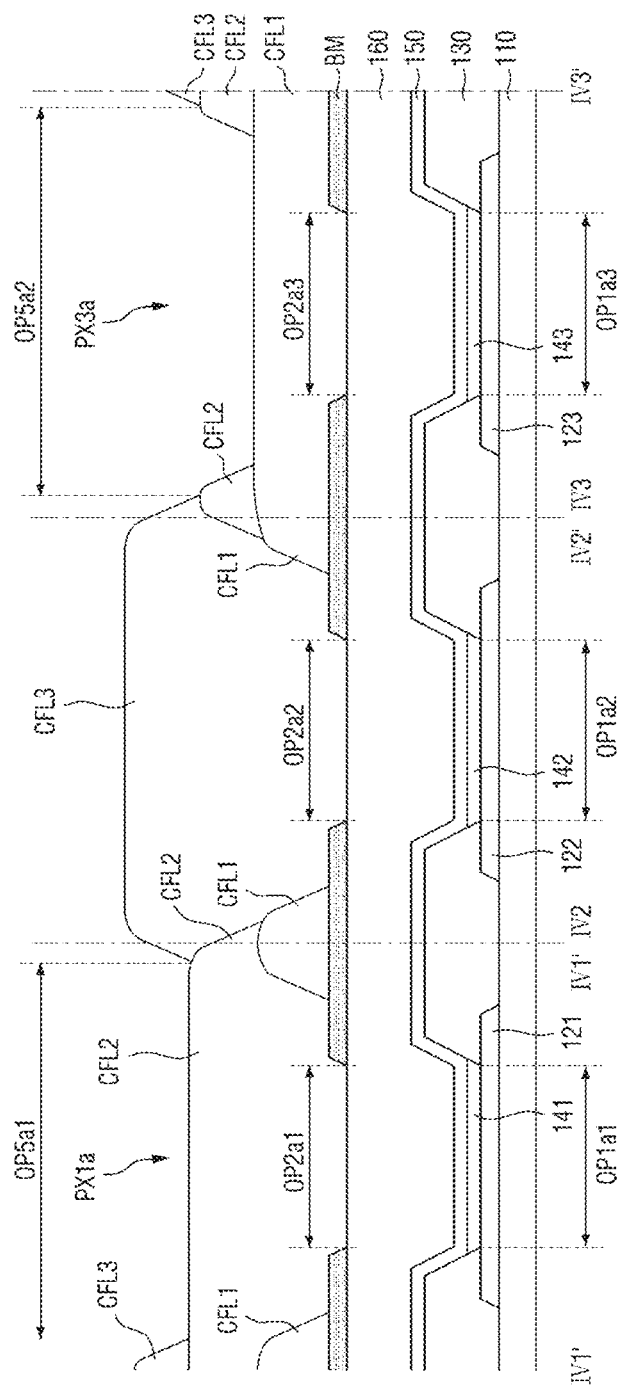
FIG. 28 is a sectional view showing an organic light emitting display device according to another embodiment of the present inventive concept.

FIG. 28 is a sectional view showing an organic light emitting display device according to another embodiment of the present inventive concept.

Referring to FIG. 28, a third color filter layer CFL3 may be disposed on the second color filter layer CFL2. The third color filter layer CFL3 may include a plurality of openings having a first opening OP5a1 and a second opening OP5a2. Also, the third color filter layer CFL3 overlaps with the second organic light emitting layer 142, the opening OP1a2 of the pixel defining film 130, and the opening OP2a2 of the black matrix BM. That is, the third color filter layer CFL3 may be formed to cover an entire surface of the second color filter layer CFL2 except regions of a plurality of first openings OP5a1 and a plurality of second openings OP5a2.

More specifically, the third color filter layer CFL3 may be formed to surround the openings OP2a1 and OP2a3 of the black matrix BM when viewed from the top.

As an example, the third color filter layer CFL3 may be a green color filter layer selectively transmitting green light. Thus, the second pixel PX2a may display a green color.

That is, the organic light emitting display device shown in FIG. 28 may include the third color filter layer CFL3 instead of the second color filter CF2a.

Figure 29:
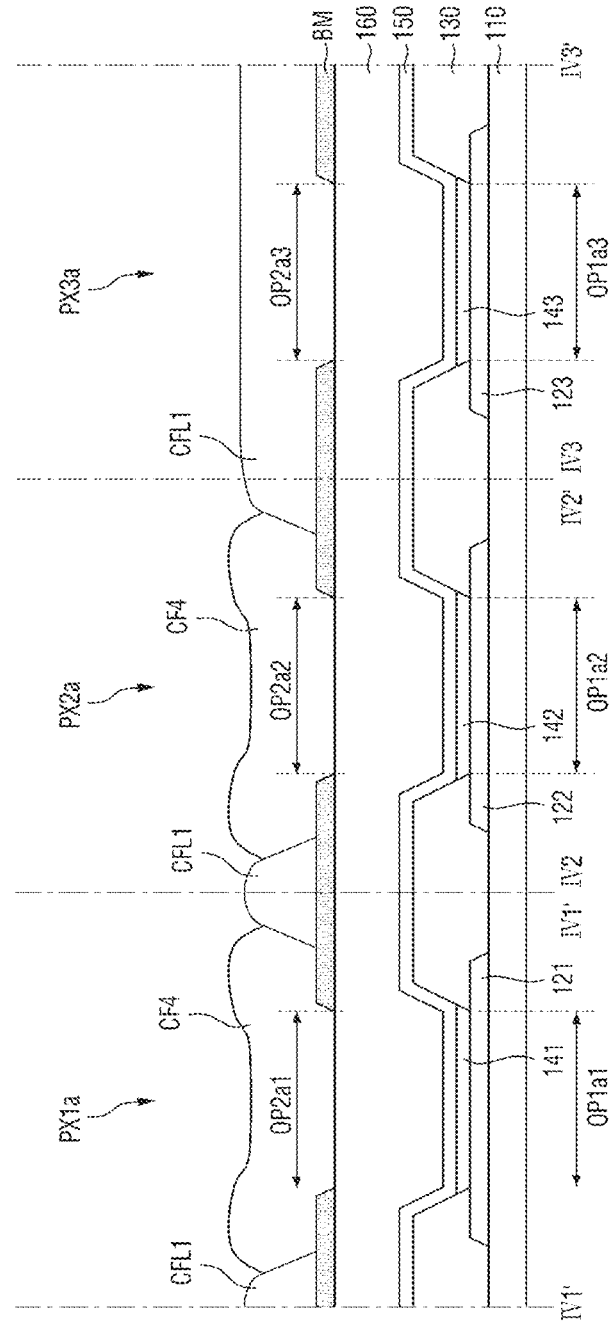
FIG. 29 is a sectional view showing an organic light emitting display device according to another embodiment of the present inventive concept.

FIG. 29 is a sectional view showing an organic light emitting display device according to another embodiment of the present inventive concept.

Referring to FIG. 29, a fourth color filter CF4 may be disposed on the first color filter layer CFL1. The fourth color filter CF4 may overlap with the first organic light emitting layer 141, the second organic light emitting layer 142, the openings OP1a1 and OP1a2 of the pixel defining film 130, and the openings OP2a1 and OP2a2 of the black matrix BM. As an example, the fourth color filter CF4 may be a yellow color filter selectively transmitting yellow light.

The types of the colors of the first color filter layer CFL1, the second color filter layer CFL2, and the third color filter layer CFL3 and the order in which the first color filter layer CFL1, the second color filter layer CFL2, and the third color filter layer CFL3 are formed are not particularly limited. However, when the first color filter layer CFL1 formed on the lowest portion among the color filters or the color filter layers is a blue color filter layer having relatively low transmissivity, it is possible to enhance quality of displayed images. Also, the first color filter layer CFL1, the second color filter layer CFL2, and the third color filter layer CFL3 have been described as a blue color filter layer, a red color filter layer, and a green color filter layer, respectively, but are not limited thereto. For example, each of the first color filter layer CFL1, the second color filter layer CFL2, and the third color filter layer CFL3 may be any one of a cyan color filter layer, a magenta color filter layer, and a yellow color filter layer.

Figure 30:
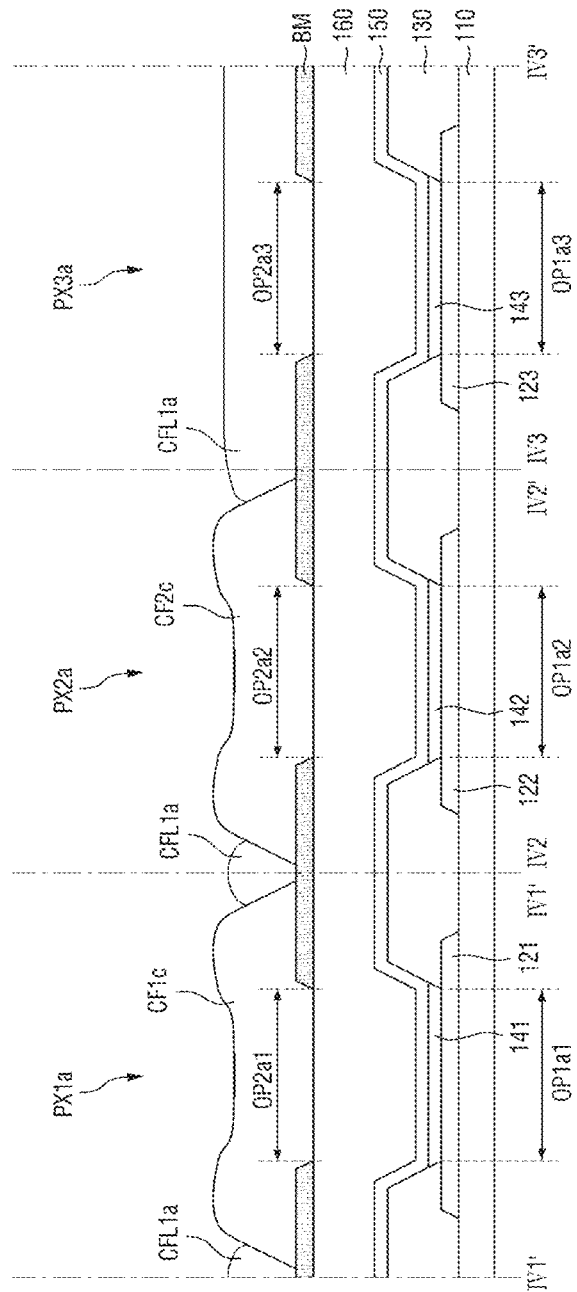
FIG. 30 is a sectional view showing an organic light emitting display device according to another embodiment of the present inventive concept.

FIG. 30 is a sectional view showing an organic light emitting display device according to another embodiment of the present inventive concept.

Referring to FIG. 30, unlike FIG. 17, a first color filter CF1c and a second color filter CF2c may be formed before a first color filter layer CFL1a is formed. That is, the first color filter CF1c and the second color filter CF2c may be sequentially formed on a black matrix BM, and the first color filter layer CFL1a may be formed to cover an entire surface of the remaining regions other than regions where the first color filter CF1a and the second color filter CF2a are disposed. That is, the first color filter layer CFL1a may be formed to surround openings OP2a1 and OP2a2 of the black matrix BM when viewed from the top.

Figure 31:
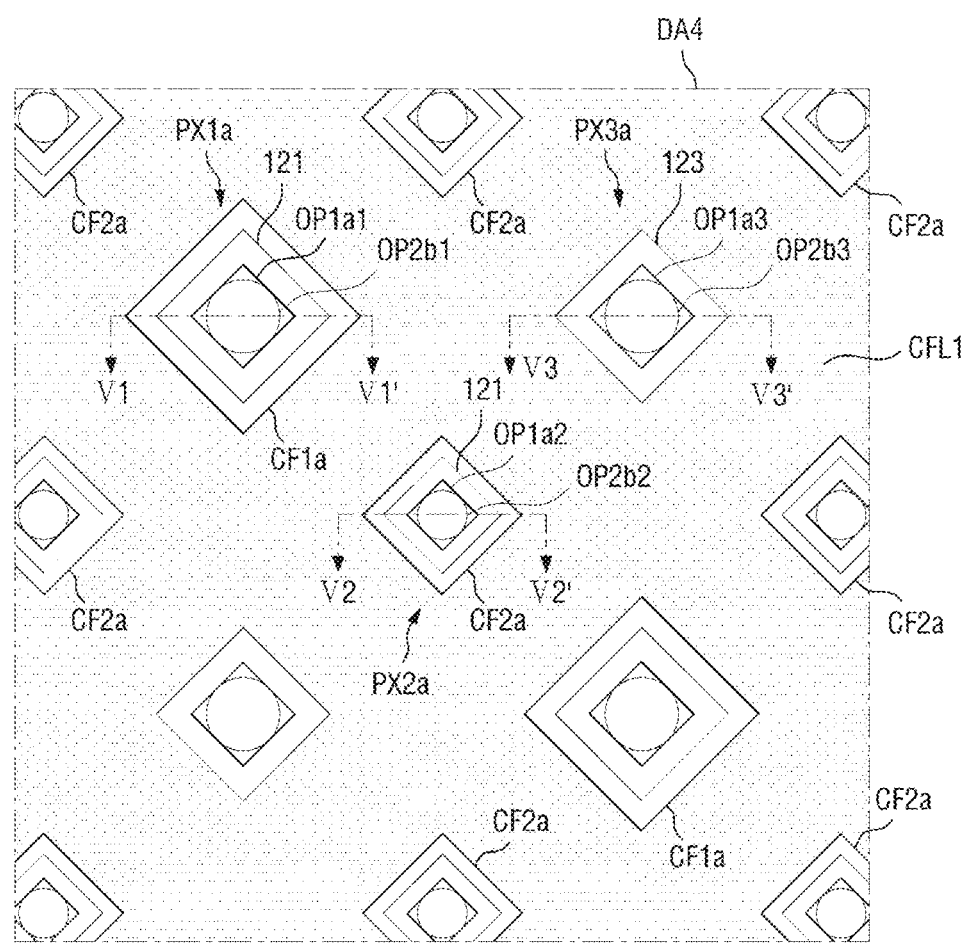
FIG. 31 is a plan view showing a pixel layout of an organic light emitting display device according to still another embodiment of the present inventive concept.
Figure 32:
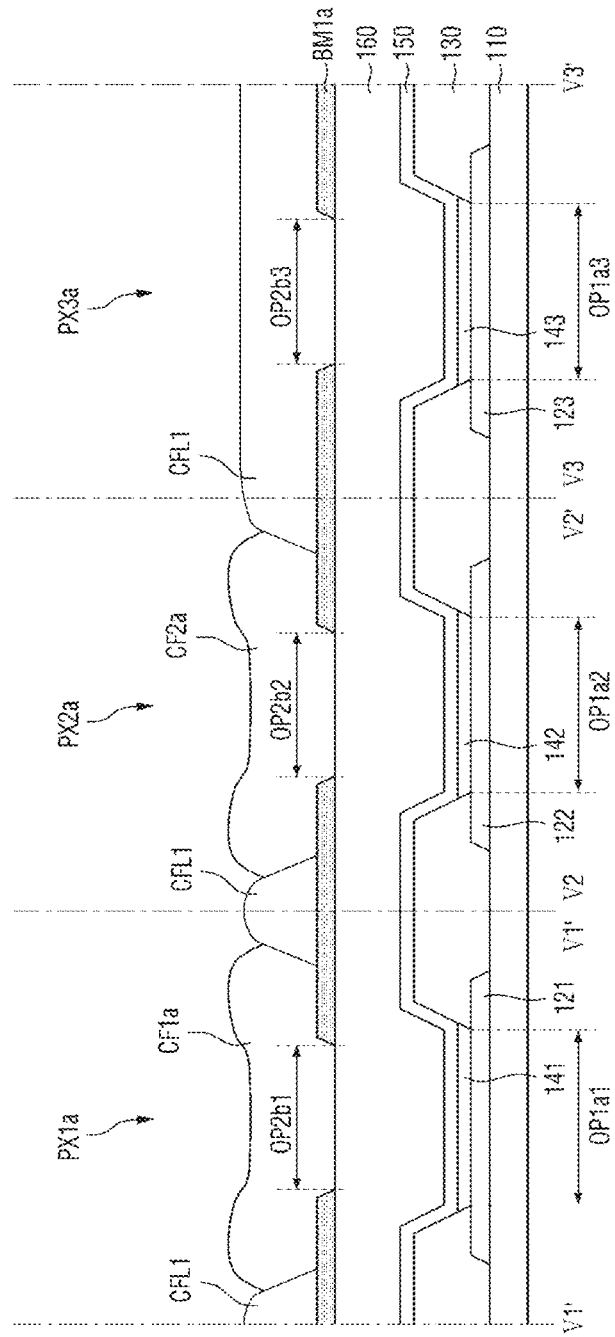
FIG. 32 is a sectional view taken along line V1-V1', line V2-V2', and line V3-V3' shown in FIG. 31.

FIG. 31 is a plan view showing a pixel layout of an organic light emitting display device according to still another embodiment of the present inventive concept. FIG. 32 is a sectional view taken along line V1-V1', line V2-V2', and line V3-V3' shown in FIG. 31.

Referring to FIGS. 31 and 32, openings OP2b1, OP2b2, and OP2b3 of a black matrix BM1a have smaller areas than openings OP1a1, OP1a2, and OP1a3 of a pixel defining film 130. That is, the openings OP2b1, OP2b2, and OP2b3 of the black matrix BM1a may fully overlap with regions of a first pixel electrode 121 exposed by the openings OP1a1, OP1a2, and OP of the pixel defining film 130.

Accordingly, since the openings OP2b1, OP2b2, and OP2b3 of the black matrix BM1a have smaller areas than regions of the first pixel electrode 121, a second pixel electrode 122, and a third pixel electrode 123 exposed by the openings OP1a1, OP1a2, and OP1a3 of the pixel defining film 130, external light may have the same form as light reflected by the first pixel electrode 121, the second pixel electrode 122, and the third pixel electrode 123.

Also, the openings OP2b1, OP2b2, and OP2b3 of the black matrix BM1a may have a circular shape. Thus, even when external light is reflected by at least one of the first pixel electrode 121, the second pixel electrode 122, and the third pixel electrode 123, it is possible to omnidirectionally and uniformly induce diffraction of reflected light. Accordingly, with the organic light emitting display device according to still another embodiment of the present inventive concept, it is possible to alleviate color separation due to external light and visibility degradation due to external light reflection.

As long as the openings OP2b1, OP2b2, and OP2b3 of the black matrix BM1a have smaller areas than the openings OP1a1, OP1a2, and OP1a3 of the pixel defining film 130, the openings OP2b1, OP2b2, and OP2b3 of the black matrix BM1a are not limited to a circular shape.

Meanwhile, in FIGS. 16 to 32, the opening of the first color filter layer CFL1 is shown as having the same size as the first color filter CF1a or the second color filter CF2a. However, this is for convenience of description, and the present inventive concept is not limited thereto.

According to embodiments of the present inventive concept, it is possible to alleviate reflected color separation due to external light.

It is also possible to reduce costs by using no polarizing plate.

It is also possible to implement uniform dispersion characteristics and reduce reflectivity.

What is claimed is:
1. A light emitting display device comprising:
   a substrate;
   a first pixel electrode disposed on the substrate;
   a pixel defining film disposed on the first pixel electrode and including a first opening at least partially exposing the first pixel electrode;
   a first light emitting layer disposed on the first pixel electrode and overlapping with the first opening of the pixel defining film; and
   a black matrix disposed on the first light emitting layer and including a first opening overlapping with the first light emitting layer, wherein
   the first opening of the black matrix has a circular shape which is composed of assemblies of dots that are spaced a same distance apart from a virtual center point of the first opening of the black matrix, and
   the first opening of the black matrix includes an outer edge with a portion of the outer edge not overlapping with the pixel defining film.
2. The light emitting display device of claim 1, wherein the first opening of the black matrix has a smaller area than the first opening of the pixel defining film.
3. The light emitting display device of claim 1, further comprising a color filter disposed to cover the first opening of the black matrix.
4. The light emitting display device of claim 3, further comprising an insulating layer disposed on the pixel defining film, wherein the black matrix and the color filter are disposed on the insulating layer.
5. The light emitting display device of claim 1, wherein the first opening of the pixel defining film is non-elliptical and substantially circular in a plan view.
6. The light emitting display device of claim 1, wherein the first opening of the black matrix does not overlap the pixel defining film.
7. A light emitting display device comprising:
   a substrate;
   a first pixel electrode disposed on the substrate;
   a pixel defining film disposed on the first pixel electrode and including a first opening at least partially exposing the first pixel electrode;
   a first light emitting layer disposed on the first pixel electrode and overlapping with the first opening of the pixel defining film;

a black matrix disposed on the first light emitting layer and including a first opening overlapping with the first light emitting layer; and a color filter disposed to cover the first opening of the black matrix, wherein the first opening of the black matrix has a circular shape which is composed of assemblies of dots that are spaced a same distance apart from a virtual center point of the first opening of the black matrix, and a width of a region in which the black matrix overlaps with one side of the color filter ranges from 6 µm to 12 µm.

8. A light emitting display device comprising:
a substrate;
a first pixel electrode disposed on the substrate;
a pixel defining film disposed on the first pixel electrode and including a first opening at least partially exposing the first pixel electrode;
a first light emitting layer disposed on the first pixel electrode and overlapping with the first opening of the pixel defining film;
a black matrix disposed on the first light emitting layer and including a first opening overlapping with the first light emitting layer;
a second pixel electrode disposed on the same layer as the first pixel electrode; and
a second light emitting layer disposed on the pixel defining film and overlapping with the second pixel electrode, wherein
the first opening of the black matrix has a circular shape which is composed of assemblies of dots that are spaced a same distance apart from a virtual center point of the first opening of the black matrix;
the pixel defining film further comprises a second opening at least partially exposing the second pixel electrode, and
the black matrix further comprises a second opening overlapping with the second light emitting layer.

9. The light emitting display device of claim 8, wherein the second opening of the black matrix has a shape with a curved portion.

10. The light emitting display device of claim 8, further comprising:
a third pixel electrode disposed on the same layer as the first pixel electrode; and
a third light emitting layer disposed on the pixel defining film and overlapping with the third pixel electrode, wherein
the pixel defining film further comprises a third opening at least partially exposing the third pixel electrode,
the black matrix further comprises a third opening overlapping with the third light emitting layer.

11. The light emitting display device of claim 10, wherein light having passed through the third opening of the black matrix, light having passed through the first opening of the black matrix, and light having passed through the second opening of the black matrix have different display colors.

12. The light emitting display device of claim 10, wherein a shortest distance from the second opening of the pixel defining film to the first opening of the pixel defining film is the same as a shortest distance from the second opening of the pixel defining film to the third opening of the pixel defining film.

13. The light emitting display device of claim 10, further comprising a first color filter layer disposed on the black matrix and including a first opening overlapping with the first opening of the black matrix and a second opening overlapping with the second opening of the black matrix, wherein the first color filter layer overlaps with the third opening of the black matrix and surrounds the first opening of the black matrix and the second opening of the black matrix.

14. The light emitting display device of claim 13, wherein the first color filter layer is a blue color filter layer for transmitting blue light.

15. The light emitting display device of claim 13, further comprising:
a first color filter overlapping with the first opening of the first color filter layer; and
a second color filter overlapping with the second opening of the first color filter layer.

16. The light emitting display device of claim 13, further comprising a second color filter layer disposed on the first color filter layer and overlapping with the first opening of the black matrix, wherein
the second color filter layer surrounds the second opening of the first color filter layer.

17. The light emitting display device of claim 10, further comprising:
a first color filter overlapping with the first opening of the black matrix;
a second color filter overlapping with the second opening of the black matrix; and
a first color filter layer disposed on the first color filter and the second color filter, wherein
the first color filter layer overlaps with the third opening of the black matrix and surrounds the first opening of the black matrix and the second opening of the black matrix.

18. A light emitting display device comprising:
a substrate;
a first pixel electrode disposed on the substrate;
a pixel defining film disposed on the first pixel electrode and having a first opening at least partially exposing the first pixel electrode;
a first light emitting layer disposed on the pixel defining film and overlapping with the first opening of the pixel defining film; and
a black matrix disposed on the first light emitting layer and having a first opening overlapping with the first light emitting layer, wherein
the first opening of the back matrix has a smaller area than the first opening of the pixel defining film, and
the first opening of the black matrix has a circular shape which is composed of assemblies of dots that are spaced a same distance apart from a virtual center point of the first opening of the black matrix.

19. The light emitting display device of claim 18, wherein the first opening of the pixel defining film is substantially circular in a plan view.

20. The light emitting display device of claim 18, wherein light having passed through the first opening of the black matrix is one of red light, green light, and blue light.

21. The light emitting display device of claim 18, further comprising a first color filter disposed to cover the first opening of the black matrix, wherein
a width of a region in which the black matrix overlaps with one side of the color filter ranges from 6 µm to 12 µm.

22. The light emitting display device of claim 18, further comprising a second pixel electrode and a third pixel electrode disposed on the same layer as the first pixel electrode, wherein
the pixel defining film further comprises a second opening at least partially exposing the second pixel electrode and a third opening at least partially exposing the third pixel electrode,
the black matrix further comprises a second opening overlapping with the second pixel electrode and a third opening overlapping with the third pixel electrode, and
light having passed through the first opening of the black matrix, light having passed through the second opening of the black matrix, and light having passed through the third opening of the black matrix have different display colors from one another.

23. The light emitting display device of claim 22, further comprising a first color filter layer disposed on the black matrix and including a first opening overlapping with the first opening of the black matrix and a second opening overlapping with the second opening of the black matrix, wherein
the first color filter layer overlaps with the third opening of the black matrix and surrounds the first opening of the black matrix and the second opening of the black matrix.

24. The light emitting display device of claim 23, wherein the first color filter layer is a blue color filter layer for transmitting blue light.

25. The light emitting display device of claim 23, further comprising a second color filter layer disposed on the first color filter layer and overlapping with the first opening of the black matrix.

26. A light emitting display device comprising:
a substrate;
a first pixel electrode disposed on the substrate;
a pixel defining film disposed on the first pixel electrode and having a first opening at least partially exposing the first pixel electrode;
a first light emitting layer disposed on the pixel defining film and overlapping with the first opening of the pixel defining film; and
a black matrix disposed on the first light emitting layer and having a first opening overlapping with the first light emitting layer, wherein
light having passed through the first opening of the black matrix is one of red light, green light, and blue light, and
the first opening of the black matrix has a circular shape or a non-elliptical polygonal shape similar to a circle which is composed of assemblies of dots that are each spaced apart from a center point of the first opening of the black matrix at a distance defined by the center point of the first opening of the black matrix and a circular or polygonal shaped perimeter of the first opening of the black matrix.

* * * * *